United States Patent [19]
Onishi et al.

[11] Patent Number: 4,822,716
[45] Date of Patent: Apr. 18, 1989

[54] POLYSILANES, POLYSILOXANES AND SILICONE RESIST MATERIALS CONTAINING THESE COMPOUNDS

[75] Inventors: Yasunobu Onishi; Shuji Hayase; Rumiko Horiguchi, all of Kanagawa; Akiko Hirao, Chiba, all of Japan

[73] Assignee: Kabushiki Kaisha Toshiba, Kawasaki, Japan

[21] Appl. No.: 938,874

[22] Filed: Dec. 8, 1986

[30] Foreign Application Priority Data

Dec. 27, 1985 [JP] Japan .................................. 60-293182
Mar. 31, 1986 [JP] Japan .................................. 61-71107
May 21, 1986 [JP] Japan .................................. 61-114673
Jun. 4, 1986 [JP] Japan .................................. 61-128081

[51] Int. Cl.$^4$ .......................... G03C 1/52; G03L 1/495
[52] U.S. Cl. ..................................... 430/192; 430/197; 430/175; 430/176; 430/270; 430/272; 430/287; 528/10; 528/43; 528/26; 528/29
[58] Field of Search .............. 430/270, 272, 175, 176, 430/197, 192, 28; 522/148, 95, 66; 528/10, 43, 26, 29

[56] References Cited

U.S. PATENT DOCUMENTS 3,410,820 11/1968 Harrod .
4,481,279 11/1984 Naito et al. .......................... 430/270
4,544,729 10/1985 Nate ..................................... 430/270
4,599,155 7/1986 Suzuki et al. .......................... 522/33

FOREIGN PATENT DOCUMENTS 0167854 1/1986 European Pat. Off. ............ 430/272
1082057 12/1956 Fed. Rep. of Germany .
0057833 4/1985 Japan .................................. 430/270
0212756 10/1985 Japan .................................. 430/270
1009654 1/1986 Japan .................................. 430/272

Primary Examiner—John C. Bleutge
Assistant Examiner—Ralph Dean, Jr.
Attorney, Agent, or Firm—Oblon, Fisher, Spivak, McClelland & Maier

[57] ABSTRACT

The polysilanes and polysiloxanes of the present invention are polymers that contain silicon in the principal chain, and contain in the side chains alkaline soluble groups such as phenol-based hydroxy group and carboxyl group.

One silicone resist material of the present invention comprises the polysilane or the polysiloxane in the above.

Another silicone resist material of the present invention contains the above polysilane or polysiloxane, and an appropriate photosensitive agent.

Still another silicone resist material of the present invention does not contain the above photosensitive agent, and in its stead, it contains a group that possesses photosensitive to ultraviolet rays or the like, via a siloxane bonding in the principal chain. As a substance with such photosensitivity, one may mention, for example, o-nitrobenzylsilyl groups that presents alkaline solubility when it is irradiated by ultraviolet rays.

Accordingly, the silicone resist materials of the present invention, especially the second and third silicone resist materials, are alkaline developable, and also possess a superior resistance to oxygen plasma. Therefore, they can be used as a top layer film in the two-layered resist system, making it possible to form very fine resist patterns, fast and with a minimum number of processing steps.

5 Claims, 10 Drawing Sheets

POLYSILANES, POLYSILOXANES AND SILICONE RESIST MATERIALS CONTAINING THESE COMPOUNDS

BACKGROUND OF THE INVENTION

1. Field of the Invention

The present invention relates to polysilanes, polysiloxanes, and silicone resist materials that contain these compounds, and more particularly to silicone resist materials that make it possible to form fine resist patterns that are used in the manufacture of integrated circuits for semiconductor elements.

2. Description of the Prior Art

In the manufacture of electronic parts for semiconductor elements, integrated circuits, and so on, fine processing techniques by means of photolithography has been used widely heretofore. The photolithographic techniques comprise a resist process and a etching process. In the resist process a desired resist pattern is formed by spreading an appropriate resist material over a single crystal silicon wafer or the like, and then irradiating it with ultraviolet rays or the like using a masking plate with desired pattern on the resist material, or irradiating it directly with electron beam using electron beam lithography system. In the etching process the film of $SiO_2$, Al or the like which is the foundation film is processed by the use of the resist pattern thus obtained.

In the fine processing techniques, accuracy of the products is dominated substantially by the performances of the photoresist which is being used, for example, by its resolving power on the substrate, its accuracy of the photosensitivity, its adhesivity to the substrate, and others.

For this reason, various kinds of exposure technique, resist material, and so forth have been proposed in order to form resist patterns with excellent properties. In recent years, however, the processing techniques are being used in a multitude of modes so that resist materials that can be easily and quickly processed are being desired on the one hand.

On the other hand, photosensitive composites have been known as resist materials that are capable of forming high precision resist patterns. However, along with the diversification of functions and advancement of the electronic instruments, there has been an increased demand for a further miniaturization of patterns in order to realize an increase in the density and the degree of integration of the device.

Now, in the existing monolayered resist method in which a single resist layer is formed over a wafer or the like, there exist various kinds of problems that become obstructions to the miniaturization of the resist patterns. Namely, the degree of reduction in the dimension of the integrated circuits in the longitudinal direction has not been as large as that in the lateral dimension, so that the ratio of the height to the width of the resist patterns has necessarily been large. Consequently, the control of the changes in the dimensions of a resist pattern on a wafer that has a complex step structure has become increasingly difficult with the progress in the miniaturization of the patterns.

Further, in various kinds of exposure systems, there are generated problems accompanying the reduction in the minimum dimensions. Thus, for instance, in the case of exposure with light, interference of the reflected light due to the level difference in the substrate is becoming to affect strongly the accuracy in the dimensions. Moreover, in the case of exposure with electron beams, it is becoming impossible to increase the ratio of the height to the width of the fine resist patterns, due to the proximity effect that is generated by the backscattering effect of electrons.

Now, it was discovered that these various kinds of problems can be resolved by adopting the multilayered resist system. The multi-layered resist system is described, for instance, in Solid State Technology, 74 (1981), but there are also published numerous studies on the system elsewhere.

In the multi-layered resist system, the most widely in general use currently is the resist system with three layer structure. This system consists of a bottom layer that serves to smooth out the steps in the substrate and to prevent the reflection from the substrate, an intermediate layer that functions as a mask in etching the bottom layer, and a top layer that serves as a photosensitive layer. Although the three-layered resist system possesses an advantage over the monolayered resist method in that it enables fine patterning, the system has a drawback in that the number of processes required up to the pattern formation has to be increased.

SUMMARY OF THE INVENTION

The general object of the present invention is to provide a variety of silicone resist materials that are adapted to the various modes of their use.

A first concrete object of the present invention is to provide silicone resist materials that can be processed easily and quickly.

A second concrete object of the present invention is to provide photosensitive silicone resist materials which make it possible to form precision resist patterns with a minimum number of processes, without the use of the three-layered resist system.

A third concrete object of the present invention is to provide silicone resist materials which contain silicon and yet permit alkaline development.

In order to achieve the above objects, the present invention provides polysilanes that contain a structure as shown by the formula

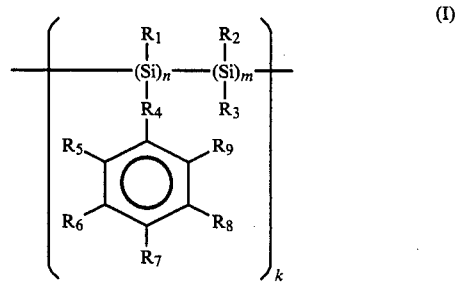

as an indispensable structure, and silicone resist materials that contain these polysilanes. In the formula, $R_1$ to $R_9$ represent substituent groups, and in particular, at least one of $R_5$ to $R_9$ represents the hydroxyl group. In the above, n and k represent positive integers, and m is zero or a positive integer.

In addition, the present invention provides polysiloxanes that contain a structure as shown in formula

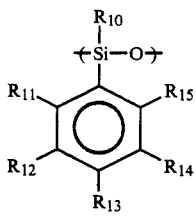

(II)

as an indispensable structure, and silicone resist materials that contain these polysiloxanes. In the formula, $R_{10}$ to $R_{15}$ represent substituent groups, and in particular, at least one of $R_{11}$ to $R_{15}$ is a hydroxyl group.

Further, the present invention provides polysiloxanes that contain a structure as shown in formula

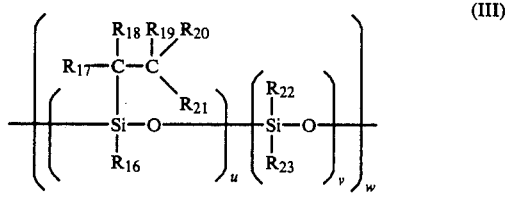

(III)

as an indispensable structure, and silicone resist materials that contain these polysiloxanes. In the formula, $R_{16}$ to $R_{23}$ represent substituent groups, and in particular, at least one of $R_{17}$ to $R_{21}$ is a group which contains a carboxyl group or a phenol-based hydroxyl group, and u and w represent positive integers and v is zero or a positive integer.

Moreover, the present invention provides silicone resist materials that consist of polysilanes and a polysiloxane that contains the structure as shown by the formula (I), (II), or (III) as an indispensable structure, and a photosensitive agent.

Still further, in order to achieve the foregoing objects, the present invention provides silicone resist materials which are characterized in that they contain a structural unit as shown by formula

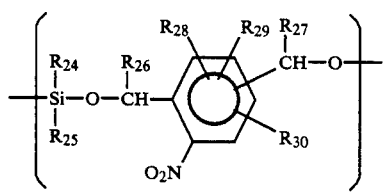

(IV)

and/or a structural unit as shown by formula

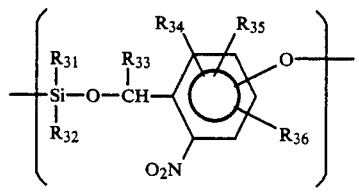

(V)

(in the formulas, $R_{24}$ to $R_{36}$ represent substituent groups), and they consist of polymers that are formed by linking each of the structural units with siloxane bonds.

Yet further, in the present invention, there are shown the methods of manufacturing the silicone resist materials described in the foregoing.

These and other objects, features and advantages of the present invention will be more apparent from the following description of the preferred embodiments taken in conjunction with the accomanying drawings.

DETAILED DESCRIPTION OF THE INVENTION

Figure 1:
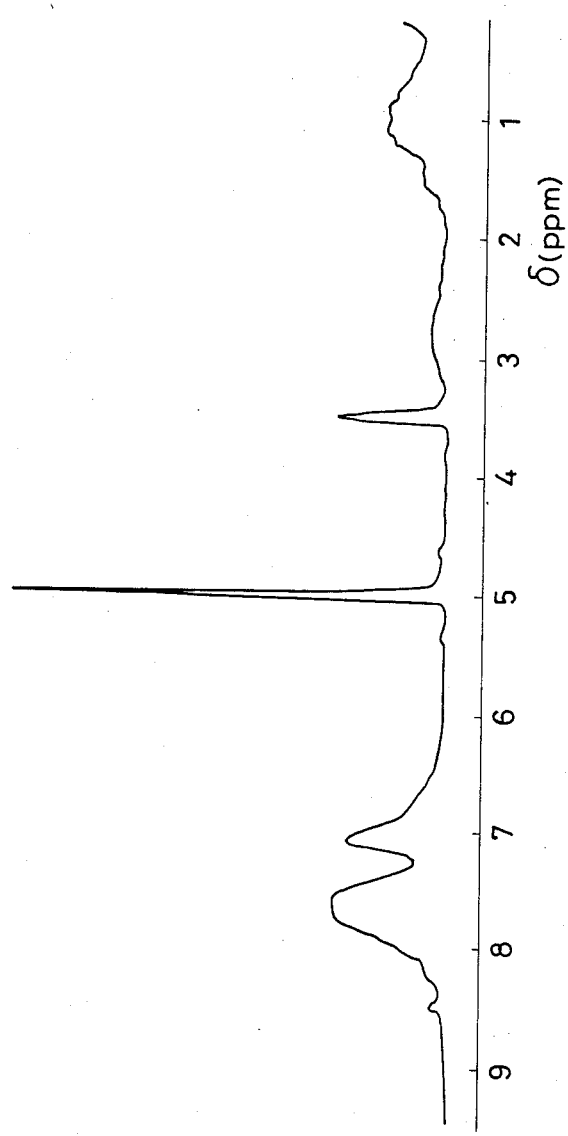
FIG. 1 and FIG. 2 are diagrams that show the $^1$H-NMR spectrum and the IR spectrum, respectively, of polysilane [XI] of Example 1.

The polysilanes, polysiloxanes, and silicone resist materials of the present invention may be used for various purposes.

For instance, the polysilanes are converted to SiC when heated to high temperatures so that they may be used as materials for ceramics.

Further, silicone resist materials that consist of the polysilane or polysiloxane and an appropriate photosensitive agent can be used widely for general photoengraving and the like.

Moreover, silicone resist materials that consist of the polysilanes or polysiloxanes can be used as the resist materials for easily and quickly forming desired patterns for semiconductor wafers or the like.

Still further, silicone resist materials that consist of the polysilane or polysiloxane and an appropriate photosensitive agent may be used as the resist materials for forming desired patterns with high precision in a minimum number of processes.

Now, the case in which the present invention is most effective is the case of forming patterns with high precision for the wafers or the like. Accordingly, the present invention will be described in terms of expressions that are suitable for that purpose. It should be reminded, however, that it does not all limit the scope of the present invention.

Four kinds of silicone resist materials, that will be used for the purpose of forming high precision patterns will be described in detail hereinafter.

SILICONE RESIST MATERIALS FOR FORMING HIGH PRECISION PATTERNS (1)

The first class of silicone resist materials to be used for the above purposes are characterized in that they contain polysilane that is represented by formula

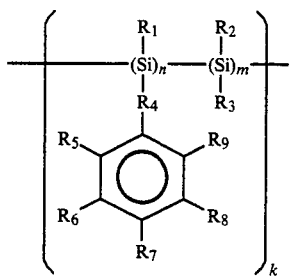

and an appropriate photosensitive agent, wherein $R_1$ to $R_9$ represent substituent groups and in particular at least one of $R_5$ to $R_9$ represents the hydroxyl group, and n and k represent positive integers, and m is zero or positive integer.

These silicone resist materials are used for the top layer film of the two-layered resist system. Namely, a silicone resist material of the present invention is spread over an appropriate bottom layer resist material that is coated directly over a silicon waver or the like. After forming a top layer resist pattern by exposure and alkaline development, a desired pattern is formed on the bottom layer film by oxygen reactive ion etching (RIE).

In order for this process to be feasible, the polysilane that is contained in the silicone resist material has to have a resistance to oxygen RIE, and in addition, it has to be developable in alkalis.

In view of this, the polysilane of the present invention contain the carboxyl group or the phenol-based hydroxyl group in formula (I), so that they are alkaline soluble.

Further, the polysilanes of the present invention contain the silicone bond in the principal chain of formula (I), so that they possess excellent resistance to oxygen gas plasma. Namely, upon receipt of irradiation of oxygen RIE, the polysilane quickly forms silicon dioxide ($SiO_2$) which is deposited on the bottom layer resist film, preventing its dispersion.

To describe the resistance to oxygen RIE of the polysilane in more detail, consider the generally known resist materials that contain silicon as shown by formula

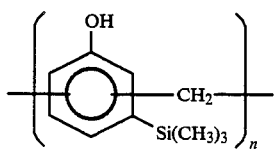

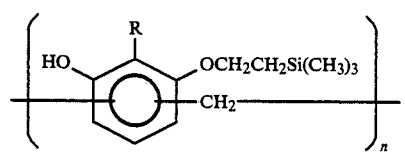

These resist materials also form silicon dioxide when they are exposed to oxygen gas plasma, so that they possess resistance to oxygen RIE. However, these resist materials contain silicon in the side chain, so that their resistance to oxygen RIE is somewhat weaker.

This difference may be understood in the following way. Namely, in silicon dioxide that is deposited, silicon atoms generally form a three-dimensional network structure by the intermediary of oxygen atoms. In the silans of the present invention, silicon atoms are arranged in a row on the principal chain. Accordingly, in forming the $SiO_2$ structure from the high molecules, after first forming (—SiO—SiO—) structure by the creeping of oxygen atoms from oxygen gas plasm in between silicon atoms, additional oxygen atoms only need be combined successively to the (—SiO—SiO—) structure.

In contrast, in the substances represented by formulae (VI) and (VII), silicon atoms are separated first from the side chains and pulled apart, and after forming the chain (—SiO—SiO—) through successive bonding of Si and O, oxygen atoms have to be received, so that it is less easy to form silicon dioxide compared with the case of the polysilanes of the present invention.

Accordingly, the silicone resist materials of the present invention have a far superior resistance to oxygen RIE in comparison to other silicone resist materials.

Now, in formula (I) for polysilane, the groups $R_1$ to $R_9$ other than the phenol-based hydrozyl group can be anything as long as the alkaline solubility and the resistance to oxygen RIE are not spoiled. However, the following choice for them may be suggested. Namely, for $R_1$ to $R_3$, hydrogen atom, alkyl group with 1 to 10 carbon atoms, or nonsubstituted or substituted aryl group with 6 to 14 carbon atoms may be suggested. For $R_4$, alkylene group with 1 to 10 carbon atoms, or nonsubstituted or substituted phenylene group with 6 to 14 carbon atoms may be considered. Further, for $R_5$ to $R_9$, hydrogen atom, hydroxyl group, carboxile group, alkoxi group with 1 to 10 carbon atoms, alkylene group with 1 to 10 carbon atoms, or nonsubstituted or substituted phenylene group with 6 to 14 carbon atoms may be considered.

In the formulae, alkyl group with 1 to 10 carbon atoms mean methyl, ethyl, propyl isopropyl, butyl, isobutyl, t-butyl, pentyl, hexyl, heptyl, octyl, nonyl, decyl, and so on. In addition, alkoxi group with 1 to 10 carbon atoms mean methoxy, ethoxy, isopropoxy, butoxy, pentyloxy, hexyloxy, heptyloxy, octyloxy, nonyloxy, decyloxy. Further, nonsubstituted or substituted aryl group with 6 to 14 carbon atoms means phenyl, p-tolyl, p-methoxyphenyl, p-chlorophenyl, p-trifluoromethylphenyl, o-tylyl, o-methoxyphenyl, p-trimethylsilylphenyl, p-tert-butylphenyl, 1-naphthyl, 2-naphthyl, 6-methyl-2-naphthyl 6-methoxy-2-naphthyl, and so on.

More precisely, these include

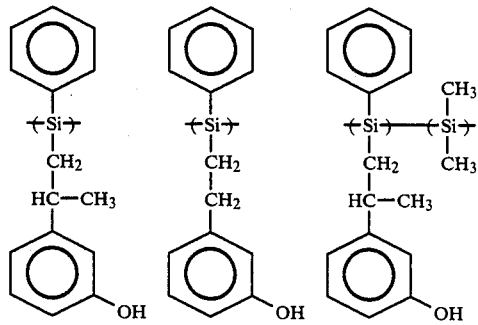

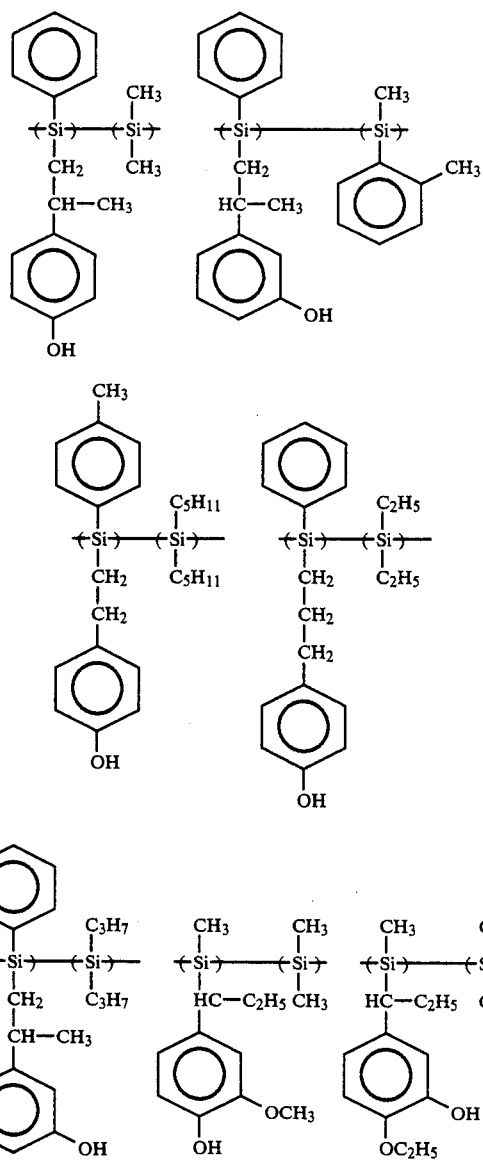

For the polysilanes, it is desirable to have number average molecular weight of 2,000 to 500,000. if the number is less than 1,000, satisfactory coated films cannot be obtained when it is dissolved in a solvent and spread, whereas if it exceeds 1,000,000, solubility to the solvent becomes poor.

The polysilane can be obtained easily by causing dichlorosilane that has phenol-based hydroxyl group protected by silyl ether to react with metallic sodium in xylene.

The polysilane is decomposed and the molecular weight is decreased by high energy radiation such as light, electron beam, and X-rays due to its chemical structure, and the solubility in alkaline solutions is enhanced than in the state of polymer. By utilizing such a property, it is possible to form positive-type patterns by developing, after exposure, in an alkaline solution. Further, by introducing partially a functional group that polymerizes under the action of high energy radiation, such as acryloyl group, into phenol based hydroxyl group or phenyl group, it can be used as a negative-type material. In this case, the exposed portion is converted to have higher molecular weight so that its solubility to an alkaline solution is reduced than for the remaining part.

The polysilanes of the present invention become SiC by being heated to high temperatures so that they can also be used as materials for ceramics.

As a photosensitive agent to be used for the present invention, use may be made of those such as diazo compounds which form positive images or of those such as azido compounds which form negative images, and there exist no special restrictions to it so long as it is known generally as a photo sensitive agent.

As such a photo sensitive agent, one may mention, for instance, naphthoquinonediazido compound or azido compound. As naphthoquinonediazido compound, one may mention sulfonic acid ester that can be synthesized, for example, from 1,2-naphthoquinone-2-diazido-5-sulfonic acid chloride and a compound that has a phenol-based hydroxyl group. As compounds that possess hydroxyl group of phenol type, one may mention, for instance, 3,4,5-trihydroxybenzoic acid ethyl ester, 2,3,4-trihydroxybenzophenone, 2,2',4,4'-tetrahydroxybenzophenone, 2,3,4,4'-tetrahydroxybenzophenone, quercetine, morin, alizarin, quinizarin, and purpurin. In addition, as azido compounds, one may mention 3,3'-diazido-diphenylsulfone, 2-methoxy-4'-azidochalcone, and 1-(p-azidophenyl)-1-cyano-4-(2-phenyl)-1,3-butadiene. Among these, preferable are those that meet requirements on the solubility to the solvent, and the sensitivity to the wavelength of the light source in the exposure device. In the stepper that is in side current use, a light source with wavelength of 436 nm is being employed. For 436 nm, it is preferred to adopt bis (1,2-naphthoquinone-2-diazido-5-sulfonic acid)-2,3,4-trihydroxybenzo-phenone ester, 1-(p-azidophenyl)-1-cyano-4-(2-furyl)-1,3-butadiene, and so forth. These azido compounds can be used separately or as a mixed system of two or more kinds.

When the compounding ratio of the photo sensitive agent is less than 5 parts by weight, the difference in the solubilities for the exposed portion and the unexposed portion is small so that satisfactory patterns cannot be obtained. On the other hand, if it exceeds 100 part by weight, the film spreading property becomes unsatisfactory. Therefore, 10 to 50 parts by weight is preferred.

It should be noted that additives such as an ultraviolet ray absorber, surface active agent, and intensifier may be blended into the composites of the present invention.

Moreover, in the present invention, an alkaline soluble resin may also be added. As an alkaline soluble resin, use may be made of any substance as long as it is soluble to alkaline solution. Thus, one may mention, for example, novolak resins that can be obtained by condensation of phenols and formaldehyde. As the phenols, one may mention, for example, phenol, o-chlorophenol, m-chloropenol, p-chlorophenol, m-cresol, p-cresol, bisphenol A, and 4-chloro-3-cresol, 2,5-xylenol. Novolak resin can be obtained by condensing one or more than one kind of these substances with formalin. Such alkaline soluble resins not limited to novolak resins, and any resin may be used that has the aromatic ring and the hydroxyl group as the structural units, such as poly-p-vinylphenol, poly-p-isopropenylphenol, poly-(m-isopropenylphenol, copolymer of p-hydroxystyrene and methyl metacrylate, copolymer of p-hydroxystyrene and methyl acrylate, copolymer of p-isopropenylphenol and methyl acrylate, and copolymer of p-hydroxystyrene and methyl metacrylate Preferable are the copolymers of poly (p-vinylphenol) and methyl metacrylate. These resins are used separately or as a mixed system of two or more kinds.

When the compounding ratio of the alkaline soluble resin to the polysilanes exceeds 200 parts by weight, the resistance to oxygen RIE is deteriorated. Therefore, the limit of the ratio is 200 parts by weight.

To the photosensitive composite of the present invention, there may be combined, depending upon the need, a thermal polymerization preventive agent for stabilizing the storage, a halation preventive agent for preventing halation from the substrate, and an adhesivity enhancing agent for enhancing the adhesivity to the substrate.

As described later, the photosensitive composite is spread over the smoothed layer that is formed on the surface of a substrate made of silicon, aluminum, or the like, in the state of dissolution in a solvent. As the solvents that may be used, there are ketone-based solvents such as acetone, methylethylketone, methylisobutylketone, and cyclohexanone, cellosolve-based solvents such as methylcellosolve, methylcellosolve acetate, and ethyl-cellosolve acetate, and ester-based solvents such as ethyl acetate, butyl acetate, and isobutyl acetate. These solvents may be used separately or as a mixed solvent of two or more kinds.

Next, cases of using the silicone resist materials of the first kind as the top layer film of the two-layered resist system will be described in detail.

As substances on which fine patterns are formed, one may mention for example, a silicon oxide film, chrome, aluminum, and copper which is deposited on substrates.

As the resin for the bottom layer, it is appropriate to use a resin that can be removed by oxygen gas plasma. Thus, for instance, one may mention novolak resin, polyimide resin, rubber-based negative resist, novolak-based positive resist, polystyrene, polymethyl-metacrylate, positive-type resist that consists of substituted o-quinonediazido and novolak resin, polyvinyl phenol, polyester, polyvinyl alcohol, polyethylene, polypropylene, polybutadiene, polyvinyl acetate, and polyvinyl butylal. These resins may be used separately or as a mixed system.

The resin for the bottom layer is spread after dissolved in a solvent. As such solvents, there do not exist special limitations, and one may mention, for example, toluene, xylene, o-dichlorobenzene, chloroform, ethanol, isopropyl alcohol, cyclopentanone, cyclohexanone, cellosolve acetate, and ethyl ketone.

Further, spreading of the resin may be carried out according to the conventional method, but preferable to be adopted is the spin coating method. The bottom layer is required to have a thickness that can smooth out the level differences in the substrate and can withstand the treatments for the substrate. Therefore, it is necessary to have a thickness of more than about 1.5 μm.

Then, after baking the spread layer for about 0.5 to 120 minutes at 50° to 250° C., a silicone resist material of the present invention is spread over it.

The silicone resist material consists of a photosensitive agent and a polysilane that contains the formula (I) as mentioned earlier. As the photosensitive agent, there is no restrictions so long as it is a photosensitive agent that is used in general, so that one may mention, for example, naphthoquinonediazido compounds and azido compounds. As naphthoquinonediazido compounds, one may mention, for example, sulfonate that can be synthesized from 1,2-naphthoquinone-2-diazido-5-sulfonic chloride and compounds that have hydroxyl group of phenol type. As the compounds that have phenol-based hydroxyl group, one may mention, for instance, 3,4,5-trihydroxybenzoic acid ethyl ester, 2,3,4-trihydroxybenzophenone, 2,2',4,4'-tetrahydroxy-benzophenone, quercetine, morin, alizarin, quinizarin, and purpurin, 2,3,4,4'-tetrahydroxy-benzophenone. Further, as the azido compounds, one may mention 3,3'-diazidodiphenylsulfone, 2-methoxy-4'-azidochalcone, and 1-(p-azidophenyl)-1-cyano-4-(2-furyl)-1,3-butadiene. In selecting one from among these, solubility to the solvent needs be considered, and it has to have sensitivity to the wavelength of the light source in the exposure apparatus. Since light sources with wavelength of 436 nm are employed for the stepper that is in wide use currently, it is preferred, for 436 nm, to employ bis (1,2-naphthoquinone-2-diazido-5-sulfonic acid)-2,3,4-trihydroxybenzophenone ester, and 1-(p-azidophenyl)-1-cyano-4-(2-furil)-1,3-butadiene. These azido compounds may be used separately or as a mixed system of two or more kinds.

When the compounding ratio of the photosensitive agent is less than 5 parts by weight, the difference in the solubilities for the exposed part and for the unexposed part becomes small, so that satisfactory patterns cannot be obtained, whereas when it exceeds 100 parts by weight, the film spreading property becomes deteriorated. The preferable range is 10 to 50 parts by weight.

Further, depending upon the need, additives such as an ultraviolet ray absorbing agent, a surface active agent, and an intensifier may also be combined with the resist materials of the present invention.

The silicone resist material can be obtained easily by dissolving the two components mentioned above in a solvent such as cyclohexanone, and mixing them by stirring. The drying conditions for the mixture, in the case of a photosensitive composite for the top layer, are normally 50° to 200° C., preferably 80° to 120° C., and normally 0.5 to 120 minutes, preferably 1 to 60 minutes. (In the case of resin for the bottom layer, the conditions are normally 50° to 250° C., preferably 80° to 220° C., and normally 0.5 to 120 minutes, preferably 1 to 90 minutes.)

As a method of spreading such a silicone resist material, method such as rotary spreading which uses a spinner, immersion, spraying, printing, and others are available. The thickness of the spread film is adjustable by varying the spreading means, concentration of the resin component in the solution, viscosity of the solution, and so on. Following that, drying at an appropriate temperature is given. The temperature is normally less than 150° C., preferably about 70° to 120° C.

When drying is over, the photosensitive composite is exposed. Exposure is carried out according to the conventional method of irradiating with energetic radiation such as ultraviolet radiation, visible light, electron beam, and X-rays.

In such an irradiation, either of the contact or projective exposure method may be adopted. Further, the optimum amount of required exposed light in this case ie normally 1 to 100 mJ/cm², although it may vary depending upon the composition of the composite. By the irradiation, the solubility of the exposed art for alkaline solution is increased.

Next, the exposed portion where the solubility for alkaline solution is increased is removed by alkaline aqueous solution to produce a resist pattern. This is the so-called development process. Here, as the alkaline aqueous solution, one may mention tetraalkyl ammonium hydroxide aqueous solution such as tetramethyl ammonium hydroxide aqueous solution, and inorganic alkaline aqueous solution such as sodium hydroxide and pottasium hydroxide. Moreover, these aqueous solutions are normally given a concentration of less than 15% by weight. It is to be noted that development is carried out by the immersion method, spray method, and so forth.

Following the above, the resist pattern is dried. The conditions for drying are temperature of 100° to 200° C., preferably 120° to 180° C., and duration of 30 seconds to 120 minutes, preferably 1 to 90 minutes.

Next, the smoothed layer (bottom layer) is etched by oxygen RIE, by using the resist pattern formed above as the mask.

In so doing, in the resist pattern (top layer) there is formed a film that contains silicon dioxide ($SiO_2$) due to exposure to oxygen RIE. As a result, the resist pattern becomes to possess a resistance to oxygen RIE which is 10 to 100 times as large as that of the exposed portion of the bottom layer that was irradiated. When the bottom layer under irradiation is etched entirely by oxygen RIE, there will be obtained an optimal pattern profile.

By the use of a pattern formed in the above manner as a mask, etching of the substrate is carried out. Etching may be done by wet etching or by dry etching, but dry etching is preferred for the case of forming fine patterns that have line width of less than 3 μm.

In wet etching, use is made of aqueous solution of fluoric acid, aqueous solution of ammonium fluoride, and others for the case of silicon oxide film, aqueous solution of phosphoric acid, aqueous solution of acetic acid, aqueous solution of nitric acid, and others for the case of aluminum, and aqueous solution of cerium ammonium nitrate for the case of chrome.

As the gas for dry etching, use is made of $CF_4$, $C_2F_6$, $CCl_4$, $BCl_3$, $Cl_2$, $HCl$, $H_2$, and others, combined appropriately depending upon the need.

The conditions for etching are determined as the concentration of the wet etching agent within the reaction chamber, concentration of gas for dry etching, reaction temperature, reaction time, and others, depending upon the combination of the kind of the substance from which the fine pattern is to be formed and the photosensitive composite used. They are especially limited by the method of etching and others.

After etching, the unexposed portion that remains on the substrate is removed from the above-mentioned substance by means of a removal such as J-100 (made by Nagase Chemical Industry Company), oxygen gas plasma, and others.

Other necessary processes may be added safely depending upon the needs, in addition to the processes described in the above. These include, for example, a rinsing (normally with water) process that is carried out for the purpose of washing and removing the developing solution from the above-mentioned substance following the development, a pre-treatment process which is given prior to the spreading, for the purpose of improving the adhesivity between the photosensitive composite and the substance from which a fine pattern is to be manufactured, a baking process which may be given before or after development, and a process of re-irradiation with ultraviolet radiation which is given prior to dry etching. It should be noted that the silicone resist material of the present invention may also be used as a conventional monolayered resist.

SILICONE RESIST MATERIALS FOR FORMING HIGH PRECISION PATTERNS (2)

A second class of the silicone resist materials that are used for the purpose of forming high precision patterns contain a polysiloxane resin that has a structural unit as shown by formula

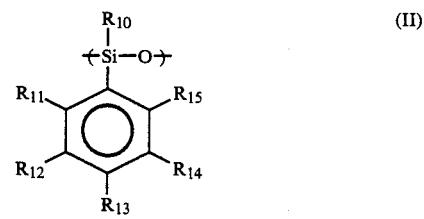

and an appropriate photosensitive composite, wherein $R_{10}$ to $R_{15}$ represent substituent groups, and in particular at least one of $R_{11}$ to $R_{15}$ is a hydroxyl group.

This silicone resist material can also be used as the top layer film of two-layered resist system.

Accordingly, the polysiloxane resin that is contained in the silicone resist material must also permit development in alkaline solution and have an excellent resistance to oxygen RIE.

From this viewpoint, the polysiloxane resin of the present invention contains the hydroxyl group (—OH) among $R_{11}$ to $R_{15}$ of formula (II), so that it is alkaline soluble.

Further, the polysiloxane contains the siloxane bond in the principal chain of formula (II), so that it has an excellent resistance to oxygen gas plasma. Namely, under the irradiation of oxygen RIE, the polysiloxane quickly forms silicon dioxide ($SiO_2$) which is deposited on the resist film of the bottom layer, preventing its dispersion.

The resistance to oxygen RIE of the polysiloxanes will be described again in detail in the following, by comparing it with that of substances that contain formula (VI) or (VII). As described earlier, in forming a three-dimensional network structure of silicon dioxide from substances that are represented by formula (VI) or (VII), a chain (—SiO—SiO—) is formed first by separating silicon atoms from the principal chain, and then, there has to be supplied oxygen atoms from the oxygen gas plasma. This increases the number of steps for the formation. Consequently, formation of silicon dioxide becomes less easy and only weak resistance to RIE will be obtained.

In contrast to this, in the polysiloxanes that have the structure as represented by formula (II), it is easy to form a three-dimensional network structure by receiving oxygen atoms from the irradiated oxygen gas plasma since the obtain (—SiO—SiO—) is contained in it to begin with.

Accordingly, the silicone resist materials of the present invention possess an excellent resistance to oxygen RIE in comparison to other silicone resist materials.

Furthermore, these polysiloxanes possess the (—SiO—SiO—) structure from the beginning, so that they present more satisfactory resistance to oxygen RIE than the first class of silicone resist materials that possess the polysilane structure.

Now, in formula (II), the groups $R_{10}$ to $R_{15}$ other than the hydroxyl group (—OH) may be anything as long as they do not spoil the alkaline solubility and resistance to oxygen RIE. However, as $R_{10}$, one may mention alkyl group, vinyl group, allyl group, aryl group or substituted aryl group, or siloxy group or substituted siloxy group with 1 to 10 crbon atoms. Further, $R_{11}$ to $R_{15}$ may be identical or may be different, and one may mention for each, hydrogen atom, halogen atom, alkyl group, substituted alkyl groups such as halogenoalkyl group, cyanoalkyl group, and alkoxyalkyl group, carboxyl group, alkylcarbonyl group, alkoxycarbonyl group, alkoxy group, acyloxy group, allyl group, aryl group or substituted aryl group.

In addition, the alkyl group with 1 to 10 carbon atoms in formula (II) means, for example, methyl group, ethyl group, n-propyl group, isopropyl group, n-butyl group, sec-butyl group, t-butyl group, n-pentyl group, n-hexyl group, n-octyl group, n-nonyl group, or n-decanyl group. Further, the substituted aryl group means, for instance, phenyl group, o-hydroxyphenyl group, p-hydroxyphenyl group, o-methylphenyl group, p-methylphenyl group, β-naphthyl group, or p-chlorophenyl group.

Moreover, when $R_{10}$ and $R_{16}$ in formulae (II) and (III), respectively, are siloxy or substituted siloxy group, they may be a two-dimensional or a three-dimensional structure, as will be shown below which is obtained by the bonding of these groups with the adjacent siloxy group or the substituted siloxy group, or with the siloxy group or the substituted siloxy group in other molecules.

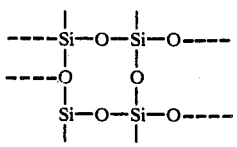
(VIII)

Furthermore, as concrete examples of the structural unit shown in formula (II), there may be mentioned those as shown below.

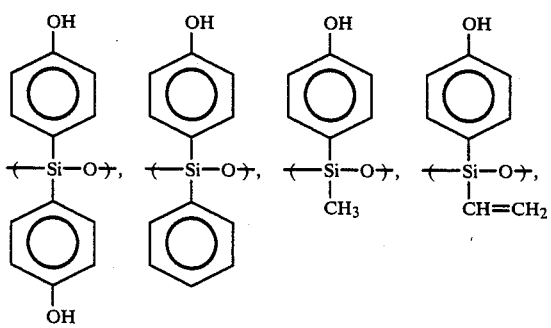

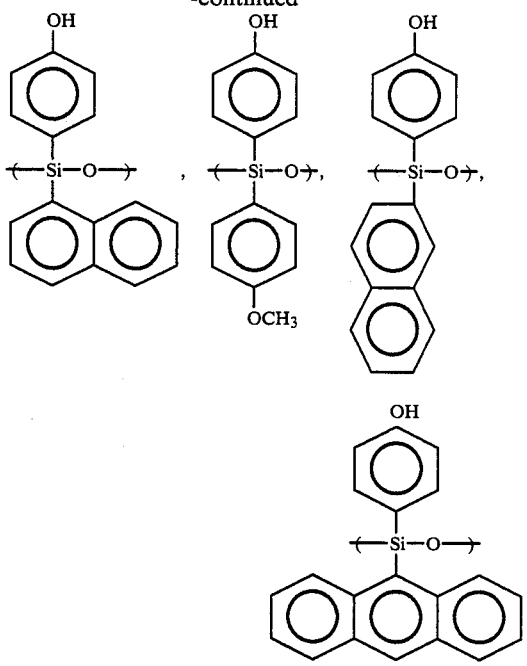

Here, the compounds shown by formula (II) can be manufactured in the following manner. Namely, by applying the manufacturing method described in Journal of Americal Chemical Society, 69, 1537 (1947), p-hydroxyphenyl lithium and tetrachlorosilane or mono-substituted trichlorosilane are brought to reaction first, to obtain a dichlorosilane compound by the reaction with trimethyl-chlorosilane, then the product is hydrolyzed.

Next, the photosensitive compound to be used for the present invention may be anything as long as it is generally known as a photosensitive agent. Thus, for instance, one may mention an azido compound, naphthoquinonediazidosulfonic acid ester, and diazonium salts. As the concrete examples of the azido compounds, there may be mentioned 4,4'-diazidochalcone, 2,6-bis (4'-azidobenzal) cyclohexanone, 2,6bis (4'-azidobenzal)-4-methylene-cyclohexanone, 1,3-bis (4'-azidobenzal)-2-propanone, 1,3-bis (4'-azidocynnamyliden)-2-propanone, 4,4'-diazidostilbene, 4,4'-diazidobiphenyl, 4,4'-diazido-diphenylsulfide, 3,3'-diazidodiphenylsulfide, 4,4'-diazidodiphenylsulfone, and 3,3'-diazidodiphenylsulfone.

In addition, one may also mention the compounds disclosed in Japanese Patents No. 50-70105, No. 50-40626, No. 49-8214, No. 48-94420, and No. 48-94419. Further, there may also be mentioned compounds that include naphthoquinonediazido group or benzoquinonediazido group. These compounds can be obtained, for example, by condensation, in the presence of weak alkali, of low molecular or high molecular compound that contains hydroxy group, and naphthoquinonediazidosulfonic chloride or benzoquinonediazidosulfonic chloride. Here, as the low molecular compounds, one may mention hydroquinone, resolcin, phloroglucin, 2,4-dihydroxy-benzophenone, 2,3,4-trihydroxybenzophenone, gallic acid alkyl ester, catechin, quercetine, quinalizarin, purprin, and others. As examples of high molecular compounds, there may be mentioned phenol-formaldehyde-novolak resin, cresol-formaldehydenovolak resin, polyhydroxystyrene, and others.

Among these compounds, preferable are the azido compounds. More preferred are naphthoquinonediazidosulfonic acid esters or arylazido compounds. These may be used separately or as a mixed system.

In the photosensitive composites of the present invention, the compounding ratio of the photosensitive compound and the polysiloxane resin that are the indispensable components is not limited in any particular manner. However, it is ordinarily set at 5 to 100 parts by weight of photosensitive compound to 100 parts by weight of the polysiloxane resin. If it is less then 5 parts by weight, sufficient difference between the alkaline solubilities for the unexposed and exposed portions cannot be obtained, and sharp patters cannot be obtained. On the contrary, if it exceeds 100 parts by weight, it cannot be spread in the form of a film.

Further, alkaline soluble resin that may be contained, depending upon the need, in the photosensitive composite of the present invention, has no special limitation so long as it is an alkali soluble resin. However, there may be mentioned, for example, poly-p-vinylphenol, poly-o-vinylphenol, poly-m-isopropenylphenol, poly-p-isopropenylphenol, m,p-cresol novolak resin, copolymer of p-vinylphenol and methyl metacrylate, copolymer of p-isopropenylphenol and anhydrous maleic acid, partial benzoyl compound of poly-p-vinylphenol, partial o-methylate of poly-p-vinylphenol, polymetacrylic acid, and polyacrylic acid. Among them, the most preferred are those that have hydroxyl group of phenol type. Further, the combining amount of the alkaline soluble resin is about 5 to 100 parts by weight for 100 parts by weight of the polysiloxane resin.

The photosensitive composites of the present invention can easily be obtained by the ordinary method, for instance, of dissolving each part in the solvent. In addition, to the composites of the present invention, there may be combined, as need arises, an intensifier dyes, surface active agent, other polymer for reforming the spread film, such as epoxy resin or polymethylmetacrylate resin, propyleneoxide-ethylene oxide copolymer, polystyrene, silicone ladder polymer, and so forth.

The pattern formation by the use of the composites of the present invention will be described in the following. First, a composite of the present invention is spread after dissolving it in a solvent. Such a solvent has no special limitations, so that one may mention, for example, toluene, xylene, o-dichlorobenzene, chloroform, ethanol, isopropyl alcohol, cyclopentanone, cyclohexanone, cellosolve acetate, and methylethyl ketone. Further, although spreading may be carried out according to the existing method, it is preferred to be done by the spin coating method.

After spreading the resin, it is given a drying. The drying conditions are, for the case of resin for the bottom layer, temperature ordinarily of 50° to 250° C., preferably 80° to 220° C., and duration ordinarily of 0.5 to 120 minutes, preferably 1 to 90 minutes. For the case of photosensitive silicone resin for the top layer, they are ordinarily 50° to 200° C., preferably 80° to 120° C., and ordinarily 0.5 to 120 minutes, preferably 1 to 60 minutes.

Next, the photosensitive composite layer of the present invention is irradiated through a mask with predetermined pattern. Exposure is carried out according to the conventional method by the irradiation of energetic beams such as visible, infrared, or ultraviolet rays or electron beams.

Following that, development is carried out by the use of a solvent. Developing is done ordinarily for 0.5 to 10 minutes by the use of an appropriate solvent such as aqueous solution of alkali, acetone, or others. Next, it is dried ordinarily for 0.5 to 120 minutes at 50° to 200° C. A predetermined resist pattern is obtained by carrying out etching for the bottom layer by the use of an appropriate solvent or oxygen plasma. Preferable is the etching by the use of oxygen gas plasma. In this case, treatment is given ordinarily at a pressure of $1 \times 10^{-4}$ to $1 \times 10^{-1}$ Torr for a duration of 1 to 120 minutes, with an energy density of 0.01 to 10 W/cm².

SILICONE RESIST MATERIALS FOR FORMING HIGH PRECISION PATTERNS (3)

A third class among the silicone resist materials that are used for the purpose of forming high precision patterns contain an appropriate photosensitive agent and a polysiloxane resin that has the structural unit as shown by formula

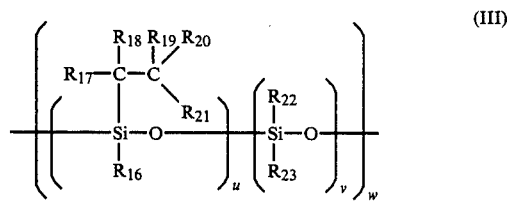

as the indispensable structure, wherein $R_{16}$ to $R_{23}$ is substituent groups, and in particular, at least one of $R_{17}$ to $R_{21}$ is a group containing a carboxyl group or a phenol-based hydroxyl group, and v and w represent positive integers, and v is zero or a positive integer.

The third silicone resist material can also used as the top layer film of the two-layered resist system. Accordingly, the polysiloxane has to be developable in alkali and has to have a satisfactory resistance to oxygen RIE. The polysiloxane contains at least one carboxyl group or phenol-based hydroxyl group among $R_{17}$ to $R_{21}$, so that it is soluble to alkalis. In addition, it contains the siloxane bond in the principal chain, so that it has a satisfactory resistance to oxygen RIE.

Consequently, these polysiloxanes possess superior resistance to oxygen RIE compared with the substances that can be represented by formula (VI) to (VII).

Now, groups $R_{16}$ to $R_{21}$ in formula (III) of polysiloxane that are other than the group containing carboxyl group and the hydroxyl group of phenol type may be anything, as long as they do not spoil the alkaline developability and the resistance to oxygen RIE. As the substituent group $R_{16}$, one may mention alkyl radical with 1 to 10 carbon atoms or substituted or nonsubstituted aryl group with 6 to 19 carbon atoms. As the substituent groups $R_{17}$ to $R_{21}$ that are other than the group containing the carboxyl group or hydroxyl group of phenol type, one may mention hydrogen atom, halogen atom, alkyl group, halogenoalkyl group, cyanoalkyl group, carboxyl group, alkylcarbonyl group, alkoxycarbonyl group, alkoxy group, alkoxyalkyl group, acyloxy group, allyl group, or substituted or nonsubstituted aryl group with 6 to 14 carbon atoms.

Further, as the alkyl group with 1 to 10 carbon atoms, one may mention, for instance, methyl group, ethyl group, n-propyl group, iso-propyl group, n-butyl group, sec-butyl group, t-butyl group, n-pentyl group, n-hexyl group, n-octyl group, n-nonyl group, and n-decanyl group. As the substituted aryl group one may mention, for example, phenyl group, o-hydroxyphenyl group, p-hydroxyphenyl group, o-methylphenyl group, p-methylphenyl group, β-naphthyl and p-chlorophenyl group.

Moreover, as concrete examples of the structural unit as represented by ( . . . )$_u$ in formula (III), one may mention the following.

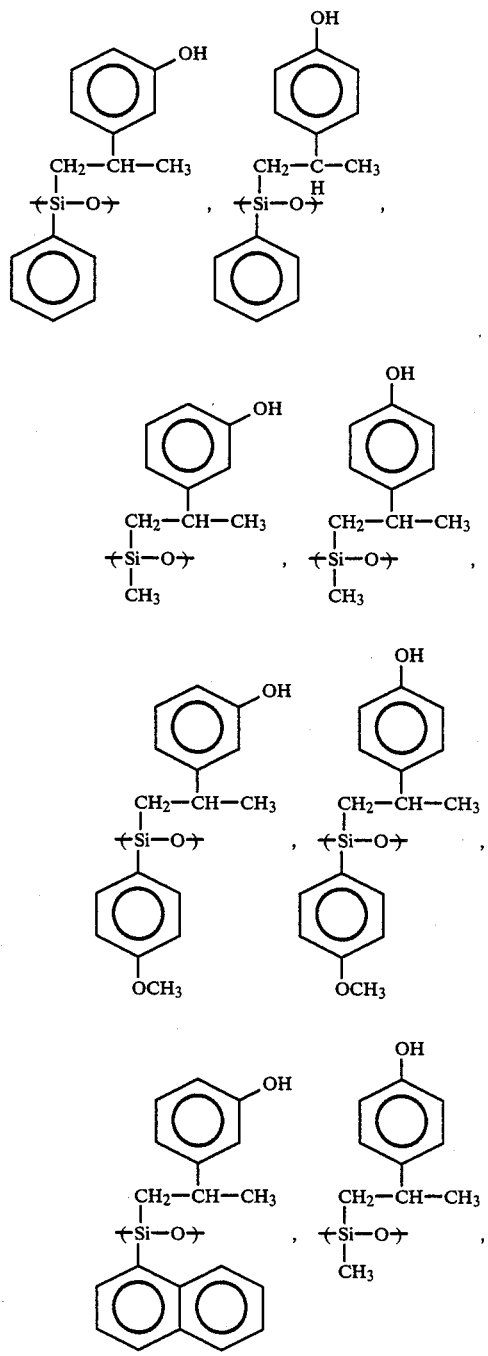

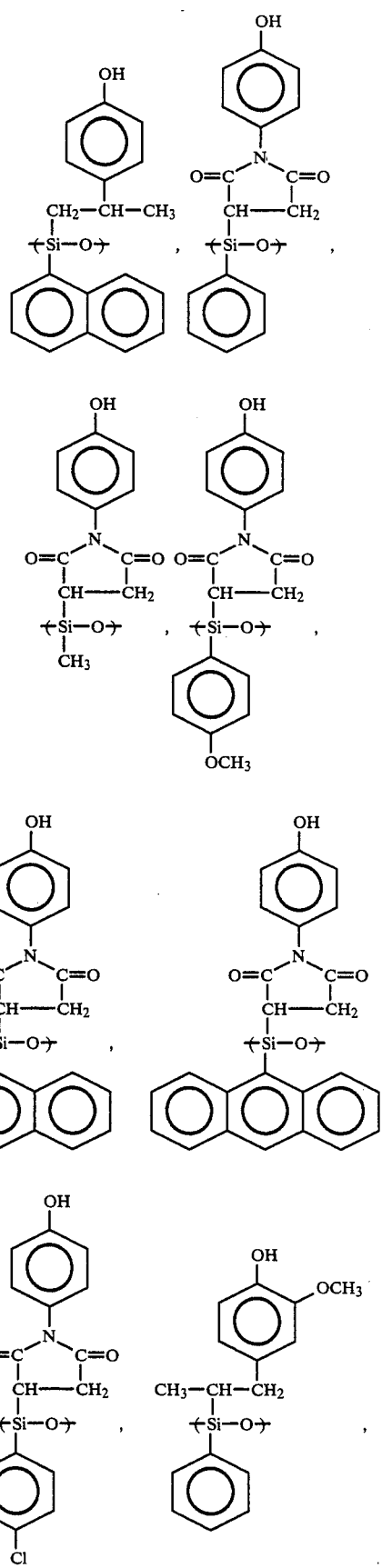

-continued
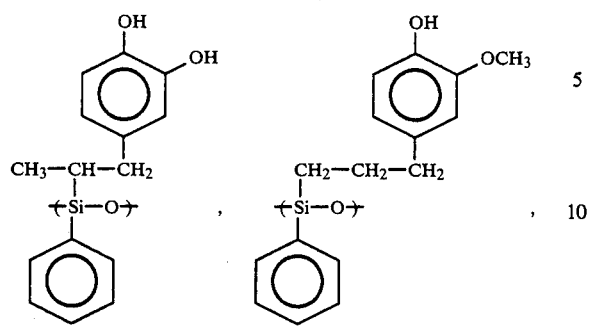
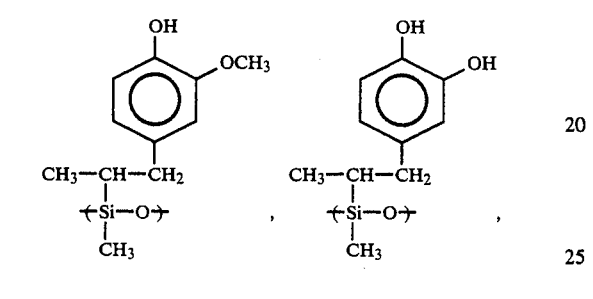
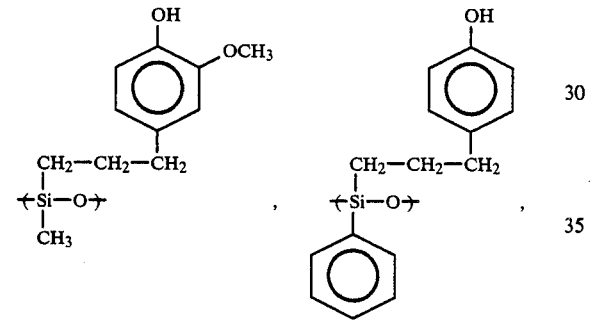
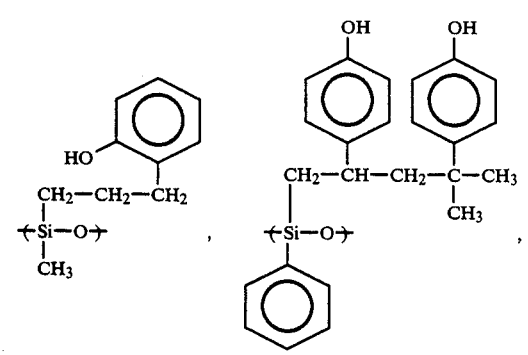
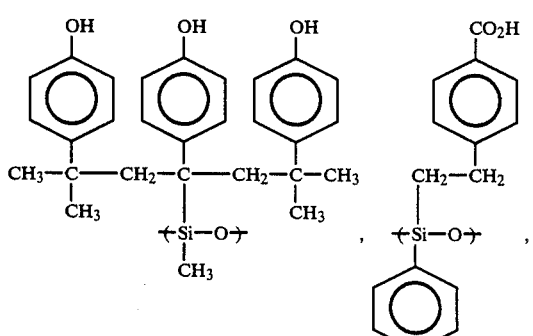
-continued
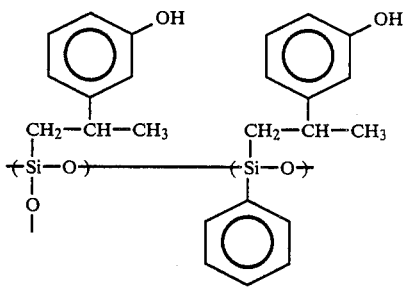
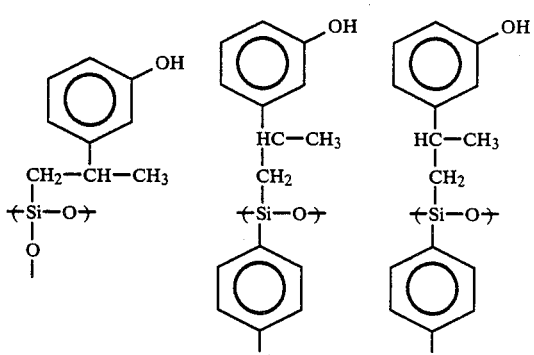
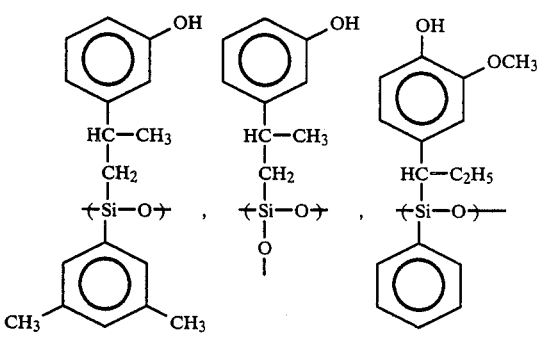
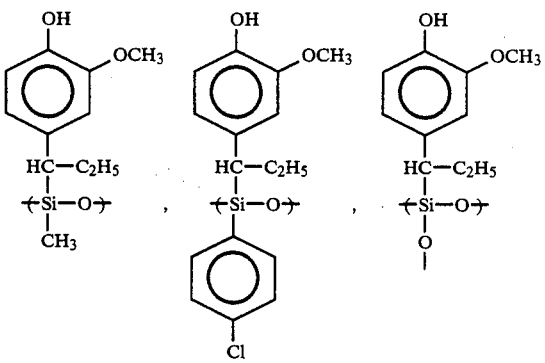
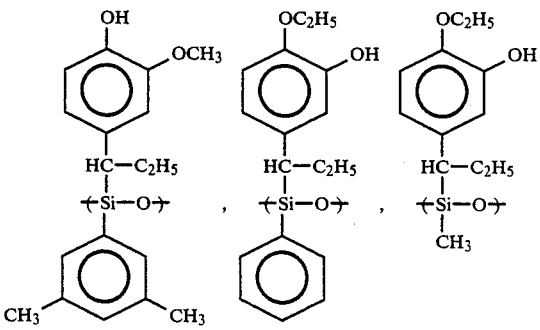

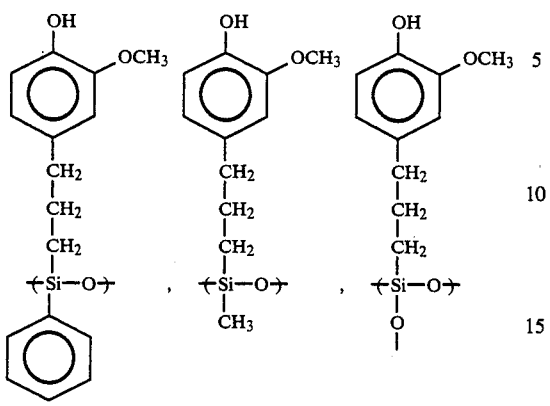

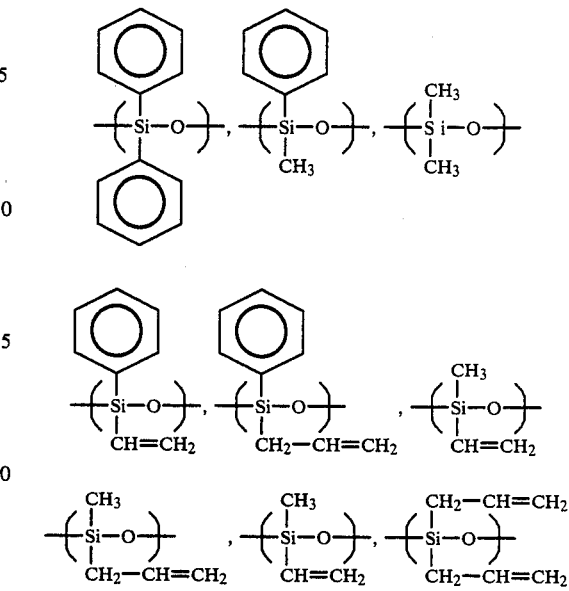

In these silicone resist materials, resist patterns are formed by the photosensitive agents that are contained in them. Accordingly, the polysiloxane that is mixed with the photosensitive agent is sufficient even if it is simply alkaline soluble. However, if the alkaline solubility can be regulated in various ways, it will be more desirable since the formation of resist patterns with higher accuracy becomes possible. A polysiloxane containing vinyl group or allyl group as $R_{22}$ or $R_{23}$ of formula (III) meets this requirement. Namely, in the polysiloxane, when it is mixed with an azido compound, there are formed bridges by the reaction of the vinyl group and the allyl group with the azido compound, making it possible to form finer patterns.

Further, as the substituent groups $R_{22}$ and $R_{23}$ in formula (III) of polysiloxane other than the vinyl or allyl group, one may mention alkyl radical that has 1 to 10 carbon atoms, aryl group or substituted aryl group, or siloxy group or substituted siloxy group. Among these, as alkyl group with 1 to 10 carbon atoms, there may be mentioned, for instance, methyl group, ethyl group, n-propyl group, propyl group, n-butyl group, sec-butyl group, t-butyl group, n-pentyl group, n-hexyl group, n-octyl group, n-nonyl group, and n-decanyl group. As the substituted aryl group, one may mention, for instance, pheny group, o-hydroxyphenyl group, p-hydroxyphenyl group, o-methylphenyl group, p-methylphenyl group, β-naphthyl group, p-chlorophenyl group, o-methoxyphenyl group, p-methoxyphenyl group, and 9-anthranyl group.

Furthermore, when $R_{16}$ in formula (III) is a siloxy group or substituted siloxy group, it may be a structure such as shown in formula (VIII) or a two-dimensional or three-dimensional structure obtained by the bonding with the siloxy group or the substituted siloxy group in other molecules.

Further, as concrete examples of the structural unit for the part ( . . . )$_v$ of formula (III), there may be mentioned the following.

It is to be noted that the compound shown by formula (III) can be manufactured, for example, by bringing a compound with unsaturated bond that is formed by protecting phenol or carbonic acid with trimethylsilyl, alkyl ether, acetyl or the like, and trichlorosilane, mono-substituted dichlorosilane or triethoxysilane, mono-substituted diethoxysilane into reaction by the use of platinum catalyst and others, and then by hydrolysis of the product.

Next, as the photosensitive agent, one may mention azido compounds that are used in the conventional photosensitive composites. In particular, one may mention 4,4'-diazidochalcone, 2,6-bis (azidobenzal) cyclohexanone, 2,6-bis (4'-azidobenzal)-4-methylenecyclohexanone, 1,3-bis (4'-azidobenzal)-2-propanone, 1,3-bis (4'-azido-cynnamyliden)-2-propanone, 4,4'-diazidostilbene, 4,4'-diazidobiphenyl, 4,4'-diazidodiphenylsulfide, 3,3'-diazidodiphenylsulfide, 4,4'-diazidodiphenylsulfone, 3,3'-diazidodiphenylsulfone, and other. In addition, compounds that are disclosed in Japanese Patents No. 50-70105, No. 50-40626, No. 49-8214, No. 48-94420, and No. 48-94410 may also be mentioned.

Furthermore, compounds that contain naphthoquinone diazido group or benzoquinonediazido group may also be mentioned as the photo sensitive agent. These compounds can be obtained, for example, by condensing naphthoquinonediazido sulfonic acid chloride or benzo-quinonediazido sulfonic acid chloride, and low molecular or high molecular compound that has hydroxyl group, in the presence of a weak alkali. Here, as the examples of low molecular compounds, there may be mentioned hydroquinone, resolcine, phloroglucin, 2,4-di-hydroxybenzophenone, 2,3,4-trihydroxybenzophenone, 2,3,4,4'-tetrahydroxybenzopherone, gallic acid alkyl ester, catechin, quereetine, quinalizarin, purpurin, and others. As examples of high molecular compound, there may be mentioned phenol-formaldehyde novolak resin, cresol-formaldehyde novolak resin, polyhydroxystyrene, and others. Among these, naphthoquinoneazidosulfonic acid ester or arylazido compound are preferred. These may be used separately or as a mixed system.

In the silicone resist materials, alkaline soluble resin that is contained for reforming the spread film is subject to no special limitations so long as it s an alkaline soluble resin. Thus, one may mention poly-p-vinylphenol, poly-o-vinylphenol, poly-m-isopropenylphenol, poly-p-isopropenylphenol, m,p-cresol novolak resin, copolymer of p-vinylphenol and methyl metacrylate, copolymer of p-isopropenylphenol and anhydrous maleic acid, partial benzoyl compound of poly-p-vinylphenol, partial o-methylate of poly-p-vinylphenol, polymetacrylic acid, polyacrylic acid, and others. Especially preferable are those compounds that contain hydroxy group of phenol type.

Further, the preferred amount of mixing of the alkaline soluble resin is 5 to 100 parts by weight for 100 parts by weight of the polysiloxane resin.

The silicone resist materials of the present invention can be obtained easily by employing conventional method such as dissolving each component in solvents. In addition, to the composites of the present invention, there may be added other polymers such as epoxy resin, polymethylmethacrylate resin, propyleneoxide-ethyleneoxide copolymer, polystyrene, and silicone ladder polymer, as intensifier, dyes, surface active agent, and for film reforming, as need arises.

Next, the process for forming patterns on wafers or the like by the use of silicone resist materials of the present invention will be described.

First, a composite of the present invention is spread by dissolving it in a solvent. There are no special limitations on the solvent. As such solvent, one may mention, for example, toluene, xylene, o-dichloro-benzene, chloroform, ethanol, isopropyl alcohol, cyclopentanone, cyclohexanone, cellosolve acetate, and methylethylketone.

Further, spreading may be carried out in accordance with the conventional method, but the spin coating method is preferred.

After spreading of resin, it is desired. The conditions of drying are, for the case of resin for the bottom layer, temperature of ordinarily 50° to 250° C., preferably 80° to 220° C., and duration of ordinarily 0.5 to 120 minutes, preferably 1 to 90 minutes. For the case of the silicone resist materials for the top layer, they are ordinarily 50° to 200° C., preferably 80° to 120° C., and ordinarily 0.5 to 120 minutes, preferably 1 to 60 minutes.

Next, the silicone resist material of the present invention which forms the top layer film is exposed through a patter mask. Exposure is carried out according to the conventional method, by the use of energetic radiation such as visible, infrared, or ultraviolet rays or electron beams.

Then, development is carried out by the use of a solvent. Development is carried out ordinarily for 0.5 to 10 minutes, using an appropriate solvent such as aqueous solution of alkali, acetone, and the like. This is because the polysiloxane in the silicone resist materials is soluble to alkali as mentioned earlier.

Following this, the product is dried ordinarily for 0.5 to 120 minutes at 50° to 200° C.

In this way, the top layer resist pattern is formed. The top layer resist pattern is used as the mask for the bottom layer resist.

Namely, when the mask is formed, oxygen RIE is carried out by irradiating oxygen gas plasma from above the mask. In that case, silicone atoms and oxygen atoms contained in the polysiloxane quickly form silicon dioxide as mentioned earlier. Consequently, the top layer film which serves as the mask displays a high resistance to oxygen RIE, only the portion of the bottom layer which is not covered by the mask is etched, and a profile of predetermined pattern is obtained.

Here, the etching with oxygen gas plasma is appropriate to be carried out for 1 to 120 minutes at a presence of $1 \times 10^{-4}$ to $1 \times 10^{-1}$ Torr at the power density of 0.01 to 10 W/cm$^2$.

In addition, in the above etching, use may be made of an appropriate solvent.

Etching of the substrate is carried out by the use of a pattern formed in the above manner as the mask. Etching may be done according to wet etching or dry etching. However, dry etching is preferred if the formation of fine patterns of less than 3 μm is to be carried out.

The unexposed portion that remains on the substrate is removed from the above substance after etching, by the use of a remover such as J-100 (made by Nagase Chemical Industry Company), oxygen gas plasma, and others.

SILICONE RESIST MATERIALS FOR FORMING HIGH PRECISION PATTERNS (4)

A fourth of silicone resist material that are used for the purpose of forming a high precision pattern contain a structural unit as shown by formula

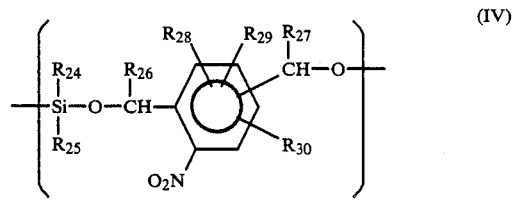

and or a structural unit as shown by formula

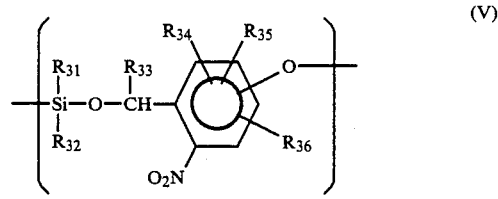

(in the figures $R_{24}$ to $R_{36}$ represent substituent groups), and consists of a polymer that is formed by linking each structural unit by the siloxane bond.

These silicone resist materials are also used as the top layer film of the two-layered resist system as in the previous case. However, these silicone resist materials do not contain photosensitive agent. Accordingly, the polymer has to possess a satisfactory resistance to oxygen RIE and a satisfactory photosensitive.

The above polymers contain o-nitrobenzylsilyl group in the principal chain of formulae (IV) and (V) so that they possess satisfactory photosensitive and developability in alkali. It is considered due to the fact that the group is changed to carbonic acid by ultraviolet radiation or the like.

Further, the polymer contains the siloxane bond in the principal chains of formula (IV) or (V) so that it has an excellent resistance to oxygen gas plasma.

Now, in formula (IV) or (V), $R_{24}$, $R_{25}$, $R_{31}$, and $R_{32}$ may be identical or may be different, and represent hydrogen atom, halogen atom, vinyl group, allyl group, nonsubstituted or substituted alkyl group with 1 to 10 carbon atoms, alcoxy group with 1 to 10 carbon atoms, nonsubstituted or substituted aryl group with 6 to 14 carbon atoms, nonsubstituted or substituted aryloxy group or siloxy group with 6 to 14 carbon atoms. $R_{26}$, $R_{27}$, and $R_{33}$ may be identical or may be different, and represent hydrogen atom, nonsubstituted or substituted alkyl group with 1 to 10 carbon atoms, or nonsubstituted or substituted aryl group with 6 to 14 carbon atoms. Finally, $R_{28}$, $R_{29}$, $R_{30}$, $R_{34}$, $R_{35}$, and $R_{36}$ may be identical or may be different, and represent hydrogen atom, nitro group, cyano group, hydroxy group, mercapto group, halogen atom, acetyl group, allyl group, nonsubstituted or substituted alkyl group with 1 to 5 carbon atoms, alcoxy group with 1 to 5 carbon atoms, nonsubstituted or substituted aryl group with 6 to 14 carbon atoms, or nonsubstituted or substituted aryloxy group with 6 to 14 carbon atoms. Moreover, in the above, halogen atom means chlorine atom, bromine atom, and iodine atom, and nonsubstituted or substituted alkyl group with 1 to 10 carbon atoms means methyl, ethyl, propyl, butyl, t-butyl, hexyl, heptyl, octyl, nonyl, decanyl, chloromethyl, chloroethyl, fluoromethyl, cyanomethyl and so on. The alcoxy group with 1 to 10 carbon atoms means methoxy, ethoxy, isopropoxy, n-butoxy, t-butoxy, hexyloxy, heptyloxy, nonyloxy, decanyloxy, and so forth, and nonsubstituted or substituted aryl group with 6 to 14 carbon atoms means phenyl, p-methoxyphenyl p-chlorophenyl, p-trifluoromethylphenyl, p-tolyl, o-tolyl, o-methoxyphenyl, p-tolylmethylsilylphenyl, p-t-butylphenyl, 1-naphthyl, 2-naphthyl, 6-methoxy-2-naphthyl, 9-anthranyl, and so on. The non-substituted or substituted aryloxy group with 6 to 14 carbon atoms means phenoxyl, p-methoxyphenoxy, p-chlorophenoxy, p-trifluoromethylphenoxy, p-methylphenoxy, o-methylphenoxy, o-methoxyphenoxy, p-trimethylsilylphenoxy, p-t-butylphenoxy, 1-naphthoxy, 2-naphthoxy, 6-methoxy-2-naphthoxy, 9-anthraoxy, and so on. These polymers may be single polymers that consist of each structural unit, or may be random block copolymers that consist of various structural units.

The number average molecular weight of these polymers is normally 2,000 to 100,000, preferably 4,000 to 50,000. If the number average molecular weight is less than 2,000, it is not possible to obtain a smoothly spread film when it is dissolved in a solvent and is spread. On the other hand, if it exceeds 100,000, solubility to the solvent becomes unsatisfactory.

These polymers may be obtained easily, for example, by the solution polymerization method in which a substituted orthonitrobenzyl alcohol or a substituted orthonitrobenzylidene alcohol and dihalogenosilane are heated in a solvent in the presence of a base such as triethylamine to generate a condensation and polymerization reaction.

As the substituted orthonitrobenzyl alcohol or substituted orthonitrobenzylidene alcohol, one may mention, for instance, 4-hydroxymethyl-2-nitrobenzyl alcohol, 4-hydroxy-2-nitrobenzyl alcohol, 3-hydroxymethyl-2-nitrobenzyl alcohol, 3-hydroxy-2-nitrobenzyl alcohol, 4,5-dihydroxy-2-nitrobenzyl alcohol, 4-hydroxymethyl-2-nitro-α-methylbenzyl alcohol, 4-hydroxy- -phenyl-2-nitrobenzyl alcohol, and 4-(-hydroxyethyl)-2-nitrobenzyl alcohol. Further, as the dihalogenosilane, one may mention, for instance, diphenyldichlorosilane, dimethyldichlorosilane, methylphenyldichlorosilane, vinylmethyl dichlorosilane, t-butylmethyldichlorosilane, diethyldichlorosilane, phenylethyldichlorosilane di (2-chloroethyl) dichlorosilane, phenyldichlorosilane, di (p-trifluoromethylphenyl) dichlorosilane, vinylphenyldichlorosilane, t-butylphenyldichlorosilane, 1-naphthyldichlorosilane, and 2-naphthyldichlorosilane. These may be used separately or as a mixed system.

These composites of the present invention may be mixed, depending upon the needs, with dyes, a surface active agent, a resin such as polystyrene and polymetacrylic acid that improves the film formation property, and so forth.

The photosensitive composites of the present invention may be manufactured easily by mixing and stirring the above components in a solvent such as cyclohexanone.

Next, an example of usage of the photosensitive composite of the present invention will be described. First, resin for the bottom layer is required to be removable by oxygen gas plasma. The bottom layer is obtained, for example, by dissolving novolak resin, polyimide resin, rubber-based negative-type resist, novolak-based positive-type resist, polystyrene, or polymethyl metacrylate in a solvent such as xylene, ethylcellosolve acetate, cyclohexanone, ethanol, and methylethyl ketone, and rotary-spreading the solution on a supporting body such as a silicon wafer, and drying (at 50° to 250° C., preferably 70° to 200° C. for 0.5 to 180 minutes, preferably 1 to 120 minutes). The thickness of the bottom layer resin is required to be able to smooth out the steps that exist in the substrate and be sufficiently thick to be able to withstand the conditions at the time of pressurizing the substrate, so that it is ordinarily necessary to have a thickness of more than 1.5 μm. Then, the photosensitive composite is dissolved in a solvent such as xylene, cyclohexanone, ethylcellosolve acetate, and methylethyl ketone, and spread, and dried (for 30 seconds at 50° to 180° C., preferably at 70° to 140° C.). After that, through, for example, a quartz mask, it is exposed to ultraviolet radiation in a proper wavelength region (200 to 400 μm) according to the conventional method. Following that, development is given by using a proper alkaline solution (1 to 15% aqueous solution of tetramethylammonium hydroxide or hydroxy-ethyl-trimethyl ammonium hydroxide). After that, it is dried, and the resin film of the bottom layer is given a patterning by oxygen gas plasma, using the pattern that is formed from the photosensitive composite as the mask. Then, the supporting body, for example, a silicon wafer is etched and metalized according to the conventional processing method.

As described in the above, the photosensitive composite of the present invention possesses an excellent sensitivity and resistance to oxygen RIE. Further, it is not affected by the level differences in the substrate so that the film thickness can be reduced. As a result, the resolving power of the pattern can be improved, and it is extremely convenient for fine processing. Further, since it can be developed in an alkaline solution, it is less easy to swell compared with the case of carrying out development by the use of an organic solvent, and hence it becomes possible to form fine patterns.

The present invention will be described in further detail in what follows by comparing the embodiments and the comparative examples.

(EMBODIMENTS)

Example 1

First 135 g of metaisopropenyl phenol and 109 g of trimethylsilyl chloride were dissolved in dehydrated ether (500 g), and 101 g of triethylamine was dropped. After filtering the salt and concentrating the filtered solution, it was distilled to obtain trimethylsilylmetaisopropenyl-phenyl ether (referred to as [IX] hereinafter).

After bringing 181 g of [IX], 177 g of phenyldichlorosilane, and 5 g of chloroplatinic acid into reaction, it was distilled to obtain [X] that is shown below.

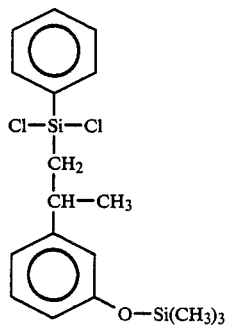

[X]

Then, 17.9 g of [X], 7.2 g of dimethyldichlorosilane, and 9.2 g of dispersed sodium were reacted for 20 hours at 130° C. in 100 ml of dehydrated xylene. The reacted substance was poured into methanol and after filtering unnecessary components, the filtered solution was concentrated. Then, after further adding water and filtering undissolved components, the filtered solution was acidified with aqueous solution or hydrochloric acid. After extracting ether, it was concentrated to obtain a polysilane (the number average molecular weight $M_n$: 230,000 and the molecular weight $M_w$: 560,000).

Figure 2:
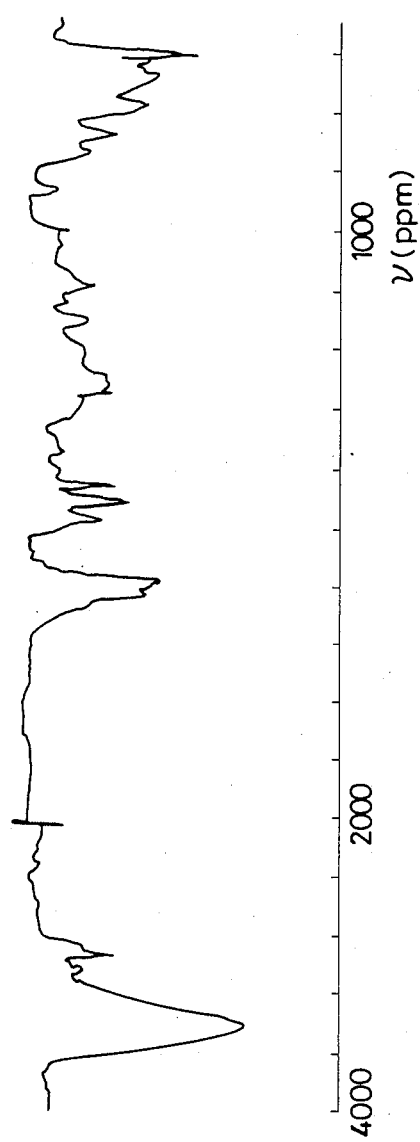

In FIG. 1 is shown the NMR spectrum of the polysilane obtained, and in FIG. 2 is shown its IR spectrum.

These graphs show that the polysilane has a structure as shown by [XI] given below.

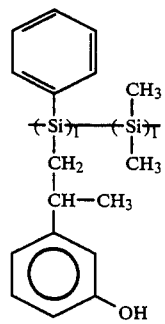

[XI]

The polysilane was found to be soluble to methanol, tetrahydrofuran (THF), and the aqueous solution of NaOH.

In contrast to that, similar polysilanes that do not possess the OH group were insoluble to methanol, THF, and the aqueous solution of NaOH.

By causing vinyl compounds to react analogously to Example 1, polysilanes of Examples 2 to 4 as shown in the following table were obtained. These were soluble to methanol, THF, and the aqueous solution of NaOH.

Figure 3:
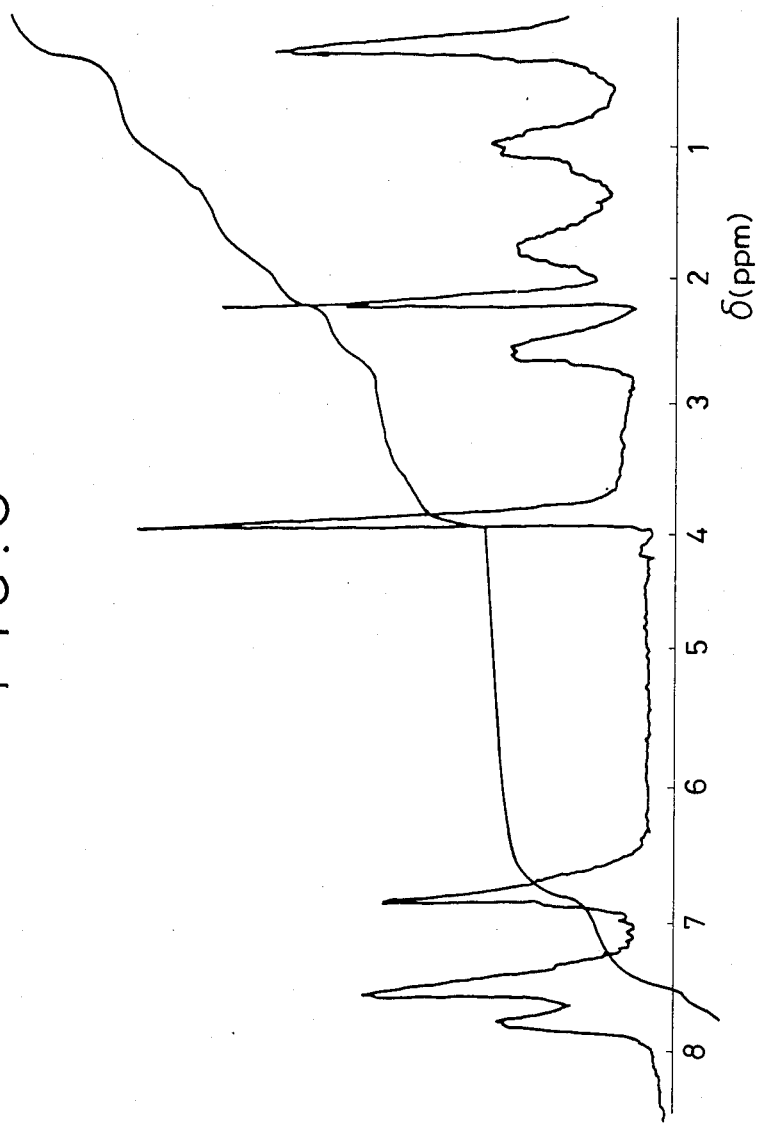
FIG. 3 to FIG. 5 are diagrams that show the $^1$H-NMR spectra of polysilanes of Examples 2, 3 and 4.
Figure 4:
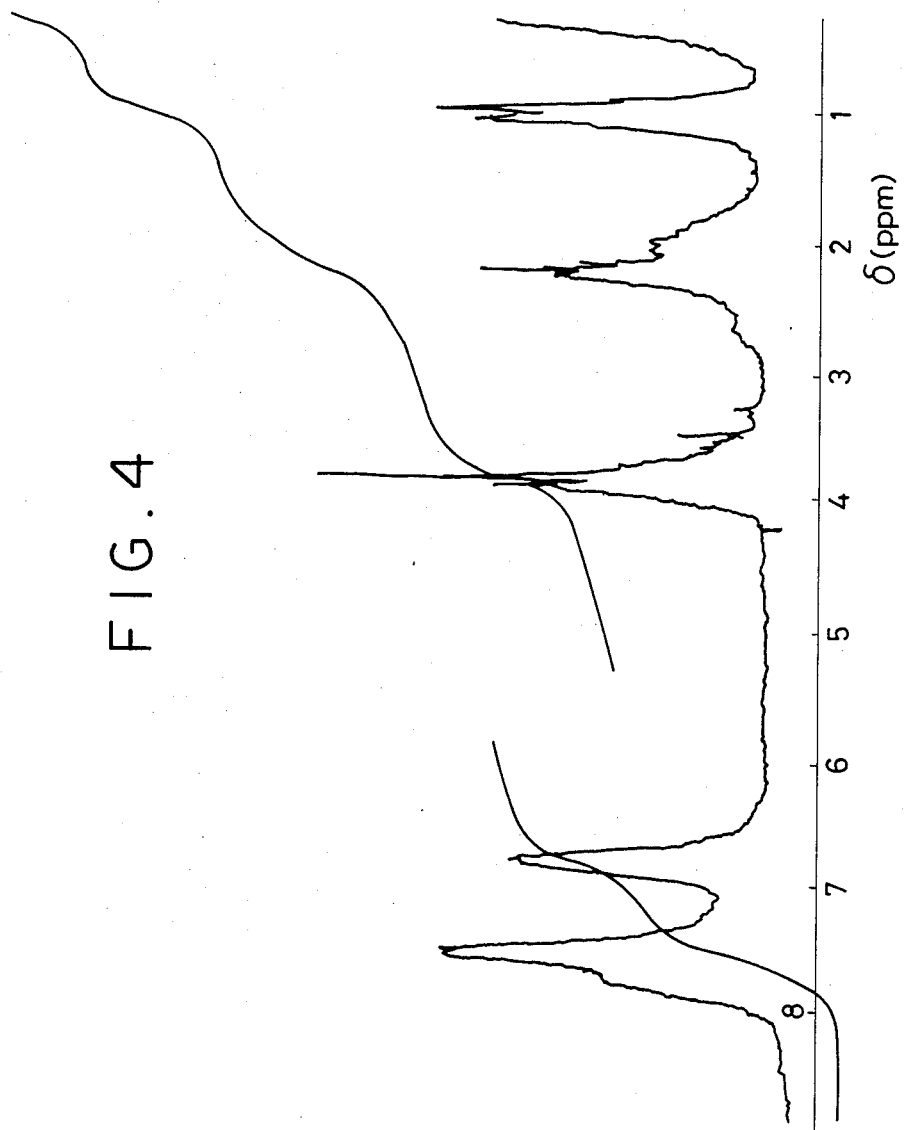
Figure 5:
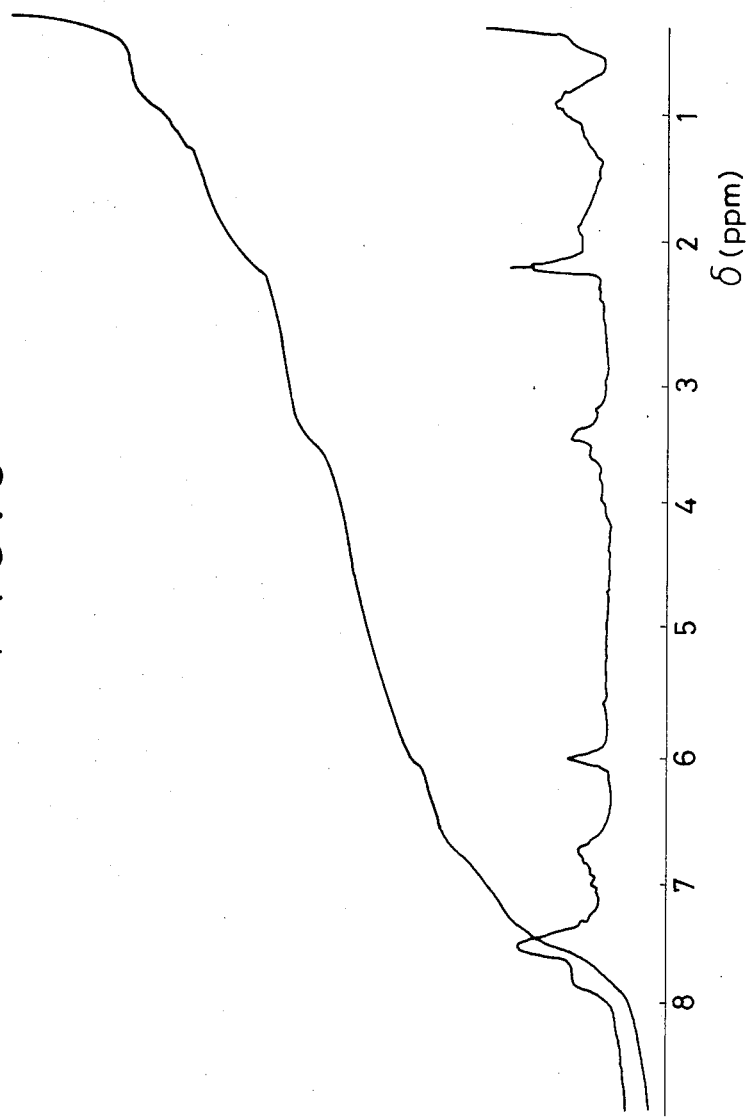

The $^1$H-NMR spectra for Examples 2, 3, and 4 are shown in FIGS. 3, 4, and 5, respectively.

Examples 2 to 4

| | Vinyl Compound to be Reacted | Polymer Structure | Molecular Weight (Mw) |
|---|---|---|---|
| Example 2 | CH$_2$=CH–CH$_2$–C$_6$H$_3$(OCH$_3$)(OSi(CH$_3$)$_3$) | (see structure) | 2500 |
| Example 3 | CH$_3$–C(=CH)–CH$_2$–C$_6$H$_3$(OCH$_3$)(OSi(CH$_3$)$_3$) | (see structure) | 3500 |
| Example 4 | CH$_3$–CH=CH–C$_6$H$_3$(OCH$_3$)(OSi(CH$_3$)$_3$) ... | (see structure) | 3000 |

Example 5

Five grams of a polymer with number average molecular weight 7,000 shown by

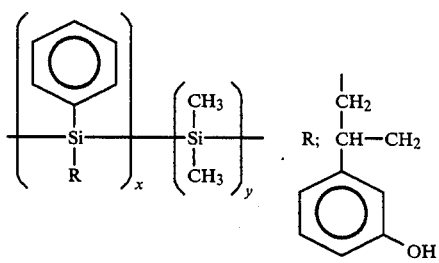

(In the formula, x:y = 1:1), 5 g of m,p-cresolnovolak resin (number average molecular weight 1,200), and 4 g of di (1,2-naphtho-quinone-2-diazido-5-sulfonic acid)-2,3,4-trihydroxy-benzophenone ester were dissolved in 100 g of cyclohexanone, and they were mixed by stirring to obtain a photosensitive composite of the present invention.

Next, a substrate on which was spread a sufficiently thick smoothing agent was heated for 1 hour at 200° C. Then, the photosensitive composite of the present invention which was passed through a filter of 0.2 μm was spread over the substrate to a thickness of 0.6 μm, prebaked for 5 minutes at 80° C., and then was exposed to the light (at 50 mJ/cm²) of wavelength 436 nm. After that, it was developed for 1 minute in an aqueous solution of tetramethylammonium hydroxide of 3.0% by weight. Then, the smoothed layer was etched by oxygen RIE, using the resist pattern formed as a mask. When the sectional surface was observed by the scanning electron microscope, it was confirmed that the film had a thickness of 1.5 μm and a steep profile consisting of lines of 0.5 μm width and spaces.

Example 6

Five grams of a polymer with number average molecular weight 30,000 as shown by

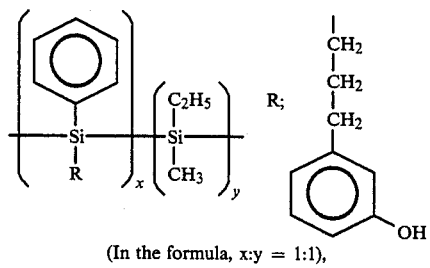

(In the formula, x:y = 1:1), 5 g of m,p-cresolnovolak resin (number average molecular weight: 1,200), and 4 g of di (1,2-naphthoquinone-2-diazido-5-sulfonic acid)-2,3,4-trihydroxybensophenone ester were dissolved in 100 g of cyclohexanone, and they were mixed by stirring to obtain a photosensitive composite of the present invention.

Example 7

Ten grams of a polymer with number average molecular weight of 7,000 as shown by

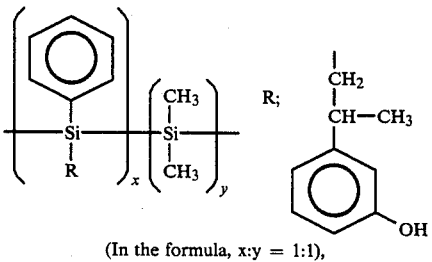

(In the formula, x:y = 1:1), and 4 g of di (1,2-naphthoquinone-2-diazido-5-sulfonic acid)-2,3,4-trihydroxybenzophenone ester were dissolved in 100 g of cyclohexanone, and a photosensitive composite of the present invention was obtained by mixing them while stirring.

Example 8

Ten grams of a polymer with number average molecular weight of 30,000 as shown by

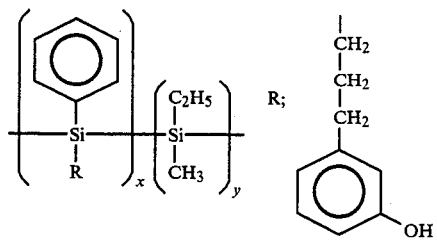

(In the formula, x:y = 1:1), and 4 g of di (1,2-naphthoquinone-2-diazido-5-sulfonic acid)-2,3,4-trihydroxybenzophenone ester were dissolved in 100 g of cyclohexanone, and a photosensitive composite of the present invention was obtained by mixing them while stirring.

By making observation on patterns that were obtained by applying treatments analogous to Example 1 to the composites formed in Examples 6 to 8, it was confirmed that the sensitivity was 50 mJ/cm² and that they had steep profiles that consist of lines of 0.5 μm width and spaces.

Example 9

Five grams of a polymer with number average molecular weight of 30,000 as shown by

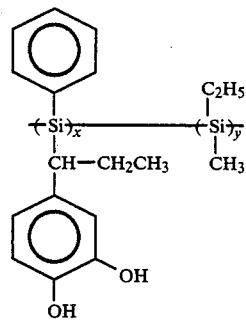

(In the formula, x:y = 1:1), 5 g of m,p-cresolnovolak resin (number average molecular weight: 1,200), and 4 g of di (1,2-naphthoquinone-2-diazido-5-sulfonic acid)-2,3,4-trihydroxybenzophenone ester were dissolved in 100 g of cyclohexanone to obtain a photosensitive composite of the present invention by mixing them while stirring.

An observation of the formed pattern by the treatments similar to Example 5 showed that the composite had a sensitivity of 60 mJ/cm² and a steep profile that consists of lines with 0.5 μm width and spaces.

Example 10

After dropping 500 g of metaisopropenylphenol into 500 g of hexamethyldisilazane and stirring for 3 hours, trimethylsilylmetaisopropenylphenyl ether (abbreviated as [XII] hereinafter) was obtained.

After bringing 106 g of [XII], 115 g of methyldichlorosilane, and 5 g of chloroplantinic acid into reaction in toluen, [XIII] was obtained by distillation.

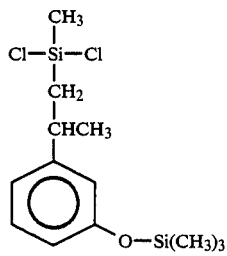

[XIII]

Figure 6:
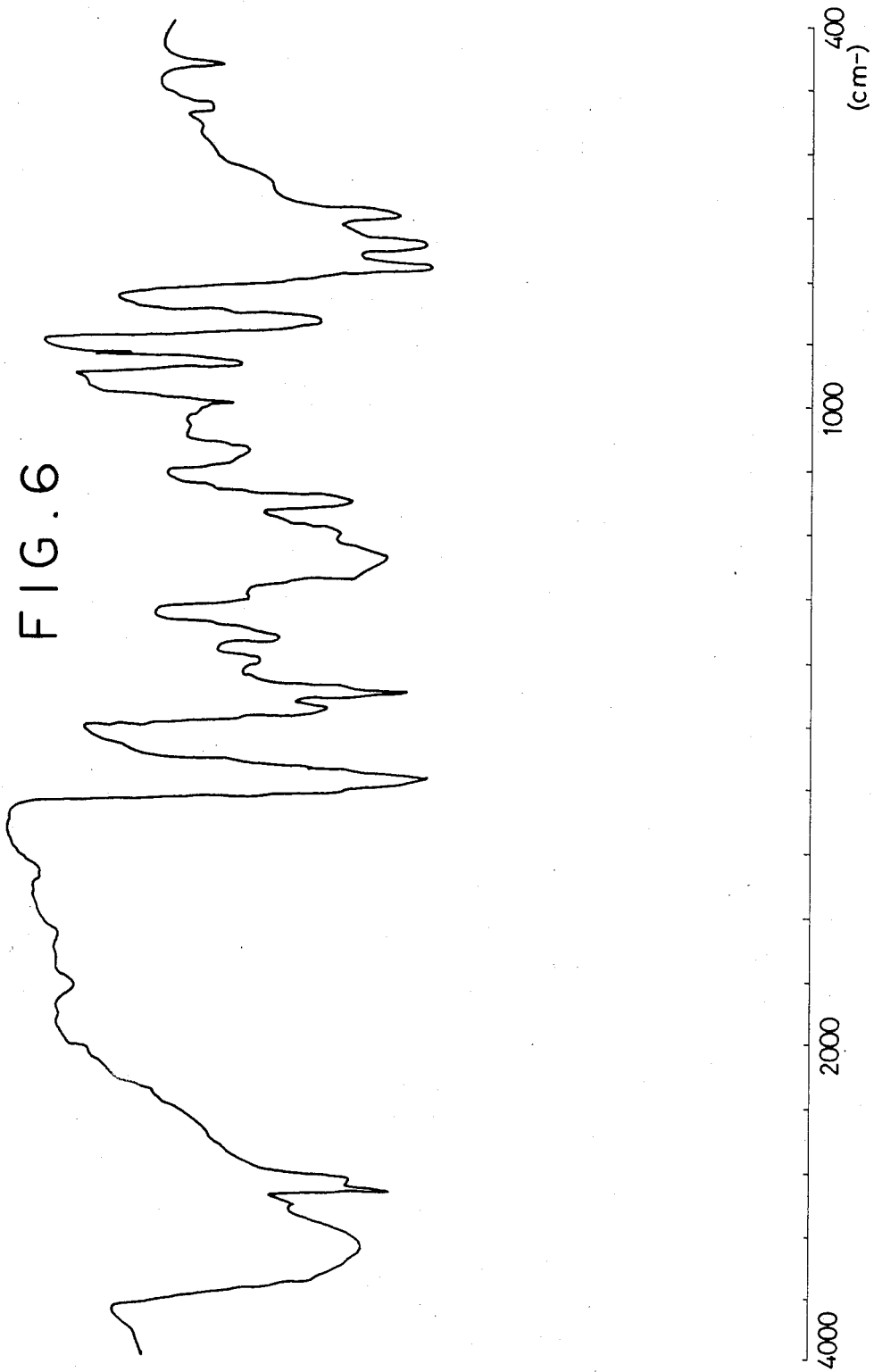
FIGS. 6 and 7 are diagrams that show the IR spectrum and $^1$H-NMR spectrum, respectively, of polysilane [XIV] of Example 10.
Figure 7:
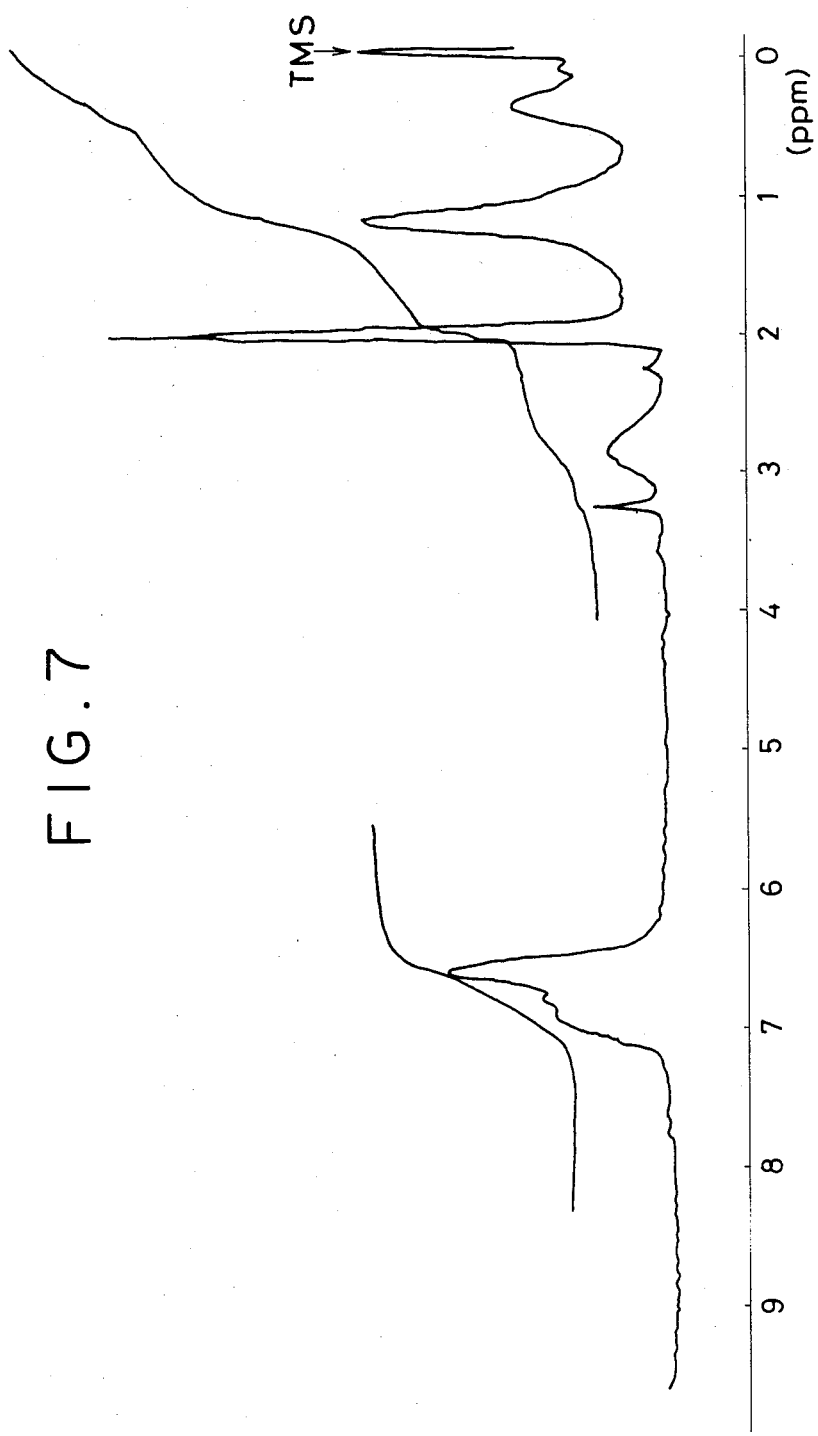

Eighty grams of [XIII] and 30 g of dispersed sodium were reacted in 200 ml of dehydrated toluen at 100° C. for 1.5 hours. Filtering and concentrating the reactant, and stirring it by pouring methanol, trimethylsilyl ether was hydrolyzed. The reactant was concentrated, dissolved in small amount of methanol, and a polysilane [XIV] was obtained by reprecipitation in water. Its number average molecular weight $\overline{Mn}$ was 22,000 and average molecular weight $\overline{Mw}$ was 39,000. In FIG. 6 is shown IR spectrum, and in FIG. 7 is shown $^1$H-NMR spectrum, of the polysilane obtained. The polysilane was found to be soluble in methanol, THF, cyclohexanone, aqueous solution of NaOH, and aqueous solution of tetramethylammonium hydroxide.

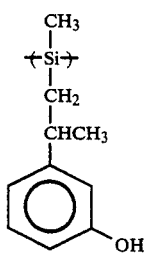

[XIV]

Example 11 to Example 13

Example 11

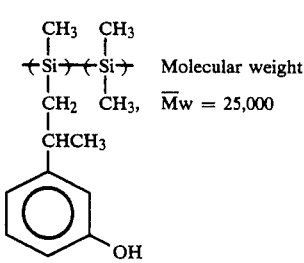

Molecular weight $\overline{Mw}$ = 25,000

Example 12

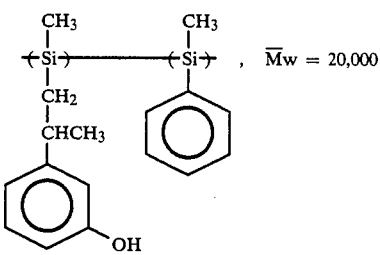

$\overline{Mw}$ = 20,000

Example 13

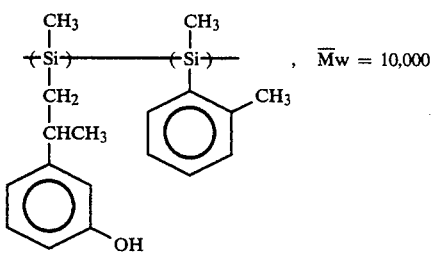

$\overline{Mw}$ = 10,000

Figure 8:
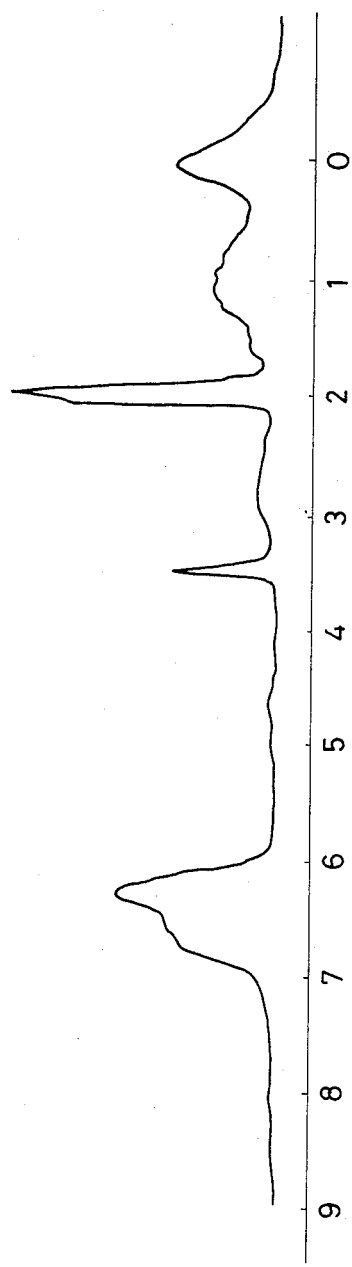
FIGS. 8 to 10 are diagrams that show the $^1$H-NMR spectra of polysilanes of Examples 11, 12, 13, respectively.
Figure 9:
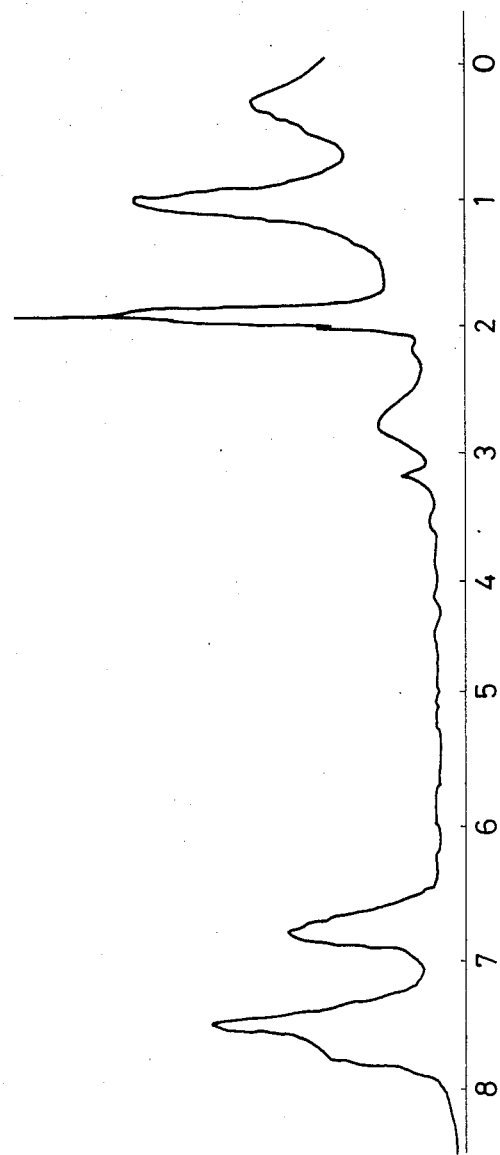
Figure 10:
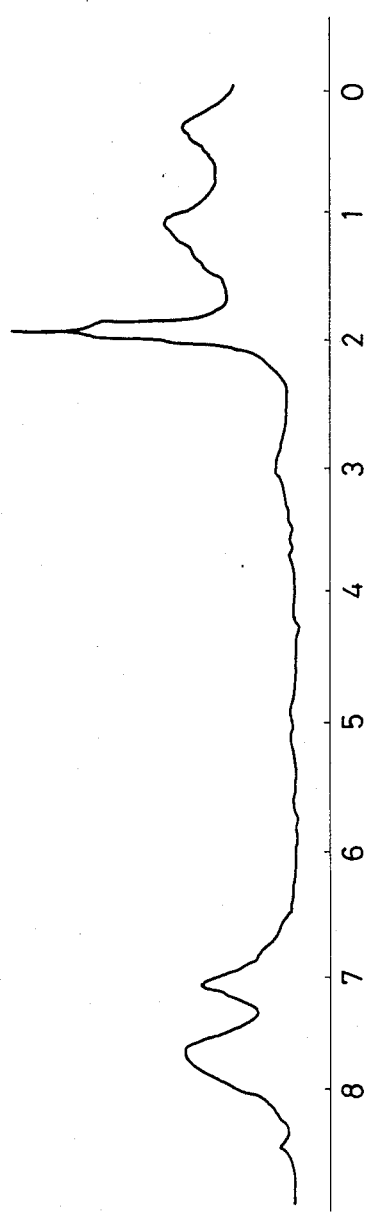

The polymer of Example 11 was obtained by bringing the chlorosilane [XIII] used in Example 10 into reaction with dimethyldichlorosilane, the polymer of Example 12 was obtained by bringing [XIII] into reaction with methylphenyldichlorosilane, and the polymer of Example 13 was obtained by bringing [XIII] into reaction with tolylmethyldichlorosilane. The reaction conditions and others were similar to those of Example 10. the $^1$H-NMR spectra for Examples 11, 12, and 13 are shown in FIGS. 8, 9, and 10, respectively.

Example 14

A bottom layer was formed by spreading the solution obtained by dissolving novolak resin in acetic acid cellosolve, on a silicon wafer with spinner, and by heating it at 220° C. for 1 hour. Then, a photosensitive coating of 0.40 μm was formed by spreading the solution obtained by dissolving 5 g of polysilane [XIII] in 10 g of cyclohexanone on the bottom layer with spinner, and by heating it at 120° C. for 5 minutes on the hot plate. Following that, the top layer was exposed to monochromatic light of 248.8 nm, and developed for 40 seconds in 0.6% aqueous solution of NaOH, dried at 80° C. for 30 minutes to form a resist pattern on the top layer. Next, the bottom layer was etched by oxygen gas plasma ($2.0 \times 10^{-2}$ Torr and 0.06 W/cm$^2$) using the pattern formed on the top layer. As a result, there were formed lines of 0.5 μm and spaces.

Example 15

A photosensitive coating of 0.6 μm thickness was formed by spreading the solution obtained by dissolving 5 g of the polysilane of Example 11 in 10 g of cyclohexanone on a bottom layer obtained similarly to Example 14. Then, it was exposed to monochromatic light of 249 nm, developed with 10% aqueous solution of NaOH for 40 seconds, and dried at 90° C. for 30 minutes to form a resist pattern on the top layer. As a result of etching th bottom layer with oxygen gas plasma using the pattern that was formed on the top layer, there were formed lines of 0.5 μm and spaces.

Example 16

Lines of 0.6 μm and spaces were formed by dissolving the polysilane of Example 12 in cyclohexanone, and by the use of a method similar to Example 15.

Example 17

Lines of 0.6 μm and spaces were formed by dissolving the polysilane of Example 13 in cyclohexanone, and by the use of a method similar to Example 15.

Example 18

The silicone resist material of the present invention was obtained by dissolving 16 g of a polymer which is shown by

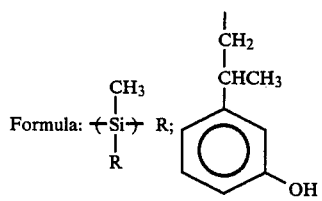

with number average molecular weight 40,000 and 4 g of di(1,2-naphthoquinone-2-diazido-5-sulfonic acid)-2,3,4-trihydroxybenzophenone ester in 50 g of cyclohexanone, and by mixing and stirring.

Next, a bottom layer of thickness 1.5 μm was formed by spreading the solution obtained by dissolving novolak resin in etylcellosolve acetate on a silicon wafer with spinner, and by heating it at 220° C. for 1 hour. The photosensitive composite of the present invention was spread on top of it to a thickness of 0.6 μm, and after pre-baking at 90° C. for 5 minutes, it was exposed to light (50 mJ/cm$^2$) of 436 nm. Following that, it was developed for 60 seconds with 3.0% by weight aqueous solution of tetramethylammonium hydroxide. Then, the smoothed layer was etched by oxygen RIE using the resist pattern formed as a mask. An observation of the cross section with scanning electron microscope revealed that it had a thickness of 1.5 μm and a steep profile with 0.5 μm lines and spaces.

Example 19

The silicone resist material of the present invention was obtained by dissolving 20 g of a polymer shown by

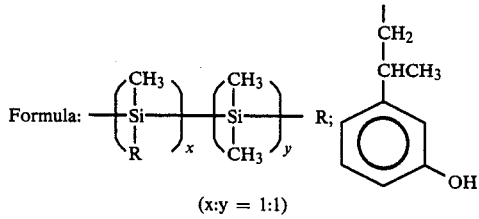

with number average molecular weight 50,000 and 5 g of di(1,2-naphthoquinone-2-diazido-5-sulfonic acid)-2,3,4-trihydroxybenzophenone ester in 50 g of cyclohexanone, and by mixing and stirring.

Example 20

The silicone resist material of the present invention was obtained by dissolving 20 g of a polymer shown by

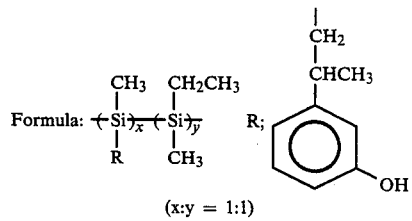

with number average molecular weight 10,000 and 5 g of di(1,2-naphthoquinone-2-diazido-5-sulfonic acid)-2,3,4-trihydroxybenzophenone ester in ethylcellosolve acetate, and by mixing and stirring.

Example 21

The silicone resist material of the present invention was obtained by dissolving 20 g of a polymer shown by

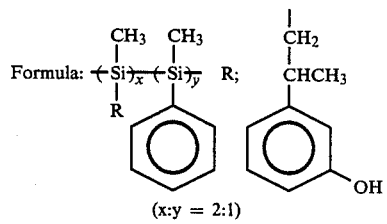

with number average molecular weight 10,000 and 5 g of di(1,2-naphthoquinone-2-diazido-5-sulfonic acid)-2,3,4-trihydroxybenzophenone ester in 50 g of ethylcellosolve acetate, and by mixing and stirring.

Example 22

The silicone resist material of the present invention was obtained by dissolving 20 g of a polymer shown by

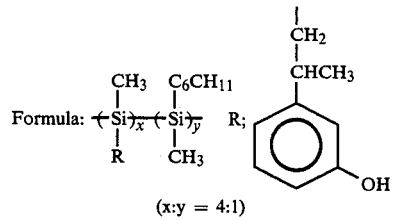

with number average molecular weight 15,000 and 5 g of di(1,2-naphthoquinone-2-diazido-5-sulfonic acid)-2,3,4-trihydroxybenzophenone ester in 70 g of ethylcellosolve acetate, and by mixing and stirring.

Example 23

The silicone resist material on the present invention was obtained by dissolving 20 g of a polymer shown by

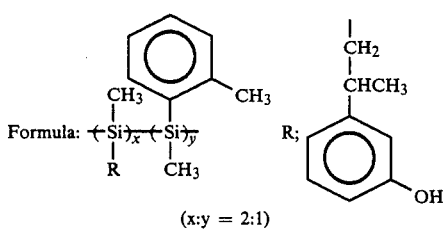

(x:y = 2:1)

with number average molecular weight 20,000 and 5 g of di(1,2-naphthoquinone-2-diazido-5-sulfonic acid)-2,3,4-trihydroxybenzophenone ester in 70 g of cyclohexanone, and by mixing and stirring.

Example 24

The silicone resist material of the present invention was obtained by dissolving 30 g of a polymer shown by

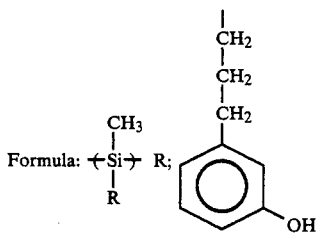

with number average molecular weight 30,000 and 10 g of di(1,2-naphthoquinone-2-diazido-5-sulfonic acid)-2,3,4-trihydroxybenzophenone ester in 100 g of cyclohexanone, and by mixing and stirring.

EXAMPLE 25

The silicone resist material of the present invention was obtained by dissolving 20 g of a polymer shown by

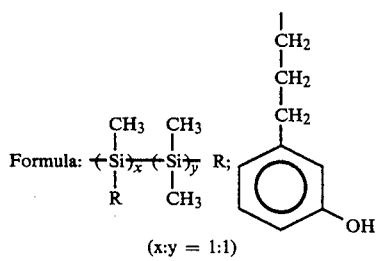

(x:y = 1:1)

with number average molecular weight 40,000 and 5 g of di(1,2-naphthoquinone-2-diazido-5-sulfonic acid)-2,3,4-trihydroxybenzophenone ester in 50 g of cyclohexanone, and by mixing and stirring.

Using the composites obtained by Examples 19 to 25, formed patterns were observed by procedures similar to Example 18. As a result, it was confirmed that they had sensitivity of 50 mJ/cm$^2$ and a steep profile with lines of 0.5 μm and spaces.

EXAMPLE 26

Eighty parts by weight of a polysiloxane resin (molecular weight: 5,000) that possesses a structural unit shown by

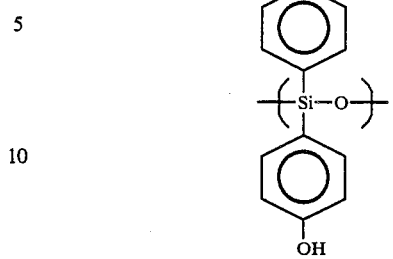

and 20 parts by weight of 4-azido-2'-methyl-4'-[N-(2-ethoxyethyl)-N-ethyl-amino]-cyanostilbene as a photosensitive composite, were dissolved in 200 parts by weight of cyclohexanone, to prepare a photosensitive composite.

Next, a bottom layer was formed by spreading with spinner a commercially available novolak-based resist OFPR-800 (manufactured by Tokyo Ohka Kogyo K.K.) on a silicon wafer, and by drying it for 1 hour at 220° C. The thickness of the bottom layer was 2.0 μm. Next, the photosensitive composite solution obtained above was spread with spinner on top of the top layer, and a photosensitive coated film with a thickness of 0.5 μm was formed by drying it on the hot plate for 2 minutes at 900° C. Following that, a resist pattern was obtained by exposing the product to an exposure apparatus for reduced projection (stepper) that employs monochromatic radiation with wavelength of 436 nm, and by developing it for 45 seconds in a 1.5% aqueous solution of tetramethylammonium hydroxide. After that, by an etching for 30 minutes that employs oxygen gas plasma (2.0×10$^{-2}$ Torr and 0.06 W/cm$^2$), there was obtained a satisfactory pattern with line width of 0.5 μm.

EXAMPLE 27

With treatments analagous to those of Example 26, except for the use of 1,2-naphthoquinonediazido-5L-sulfonic acid ester (average esterification factor of 2.0) of 2,3,4-trihydroxybenzophenone, there was formed a satisfactory pattern with line width of 0.5 μm.

EXAMPLE 28

Eighty parts by weight of a polysiloxane resin (molecular weight: 7,000) that has a structure shown by

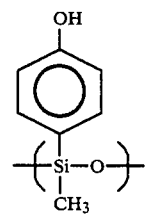

and 20 parts by weight of 1,2-naphthoquinonediazido-5-fulfonic acid ester (average esterification factor of 3.0) of purpurin as the photosensitive agent were mixed with 200 parts by weight of cyclohexanone to prepare a photosensitive composite. Pattern formation analogous to Example 26 resulted in the formation of a satisfactory pattern with line width of 0.5 μm.

EXAMPLE 29

By giving identical treatments to those of Example 26, except for the use of a resin with a structural unit as shown by

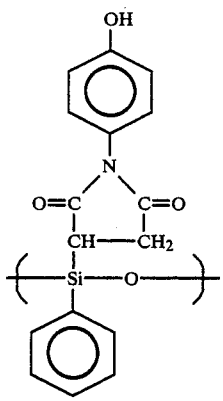

as the polysiloxane resin, there was formed a pattern with line width 0.5 μm.

EXAMPLE 30

With treatments sililar to those of Example 29, except for the use of 1,2-naphthoquinonediazido-5-sulfonic acid ester (average esterification factor of 2.0) as the photosensitive compound, there was formed a satisfactory pattern with line width of 0.5 μm.

EXAMPLE 31

With treatments similar to those of Example 29, except for the use of a polysiloxane resin that has a structural unit as shown by

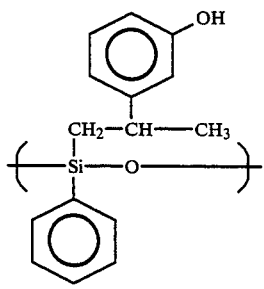

there was formed a satisfactory pattern with line width 0.5 μm.

EXAMPLE 32

One hundred parts by weight of a compound (molecular weight: 2,000) that has a structural unit shown by

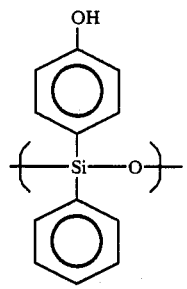

as a photosensitive compound, 50 parts by weight of 4-azido-2'-methyl-4'-[N-(2-ethoxyethyl)-N-ethylamino]-α-cyanostilbene, and 100 parts by weight of polyvinylphenole (molecular weight: 23,000) as alkaline soluble resin, were mixed and dissolved in 1,000 parts by weight of cyclohexanone to prepare a photosensitive composite. When a pattern was formed in a manner similar to Example 26, there was formed a satisfactory pattern with the line width 0.5 μm.

EXAMPLE 33

When treatments analogous to those of Example 32, except for the use of 1,2-naphthoquinonediazido-5-sulfonic acid ester (average esterification factor of 2.0) of 2,3,4-trihydroxybenzophenone as a photosensitive compound, there was formed a satisfactory pattern with line width 0.5 μm.

EXAMPLE 34

Thirty parts by weight of a polysiloxane resin (molecular weight: 3,000) that possesses a structural unit as shown by

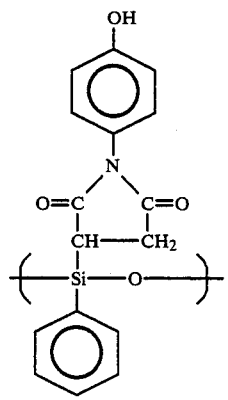

and 100 parts by weight of a commercial positive type resist OFPR-800 [manufactured by Tokyo Applied Chemistry Company, 30% of solid component (consisting of m,p-cresol novolak resin, naphthoquinonediazidosulfonic acid ester iof 2,3,4-trihydroxybenzophenone, and a solvent)] were mixed to prepare a photosensitive composite. Pattern formation analogous to Example 26 showed a formation of a satisfactory pattern with line width of 0.5 μm.

EXAMPLE 35

One hundred parts by weight of a compound (molecular weight: 2,500) that possesses a structural unit as shown by

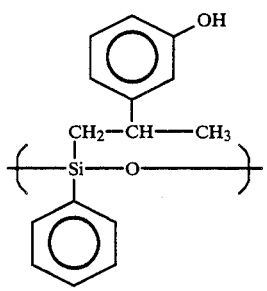

as a polysiloxane resin, 50 parts by weight of naphthoquinonediazidosulfonic acid este (esterification factor for —OH group being 80%) of quercetine as a photosensitive compound, and 50 parts by weight of m,p-cresolnovolak resin (molecular weight: 4,000) as an alkaline soluble resin, were mixed to prepare a photosensitive composite. Pattern formation analogous to Example 26 showed the formation of a satisfactory pattern with line width 0.5 μm.

EXAMPLE 36

One hundred parts by weight of a compound (molecular weight: 3,000) that possesses a structural unit as shown by

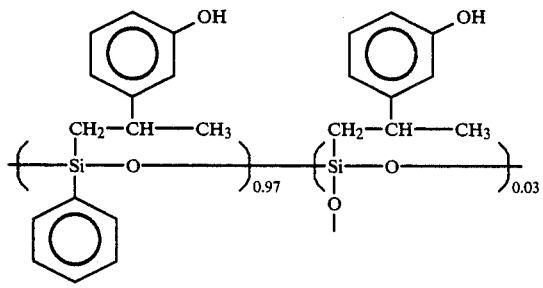

as a polysiloxane resin, 30 parts by weight of naphthoquinone-diazidosulfonic acid ester (esterification factor for —OH group being 80%) of quercetine as a photosensitive compound, and 30 parts by weight of silicone ladder polymer GR-950 (manufactured by Owens-Illinois of the United States) were mixed to prepare a photosensitive composite. Pattern formation analogous to Example 26 showed the formation of a satisfactory pattern with line width 0.5 μm.

EXAMPLE 27

With treatments analogous to Example 36, except for the use of a compound that possesses a structural unit as shown by

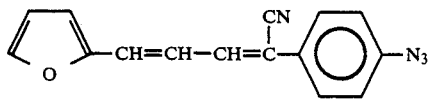

as a photosensitive compound, there was formed a satisfactory pattern with line width 0.5 μm.

EXAMPLE 38

A silicone resist material was prepared by dissolving 15 parts by weight of a polysiloxane (molecular weight: 5,000) that possesses a structural unit as shown by

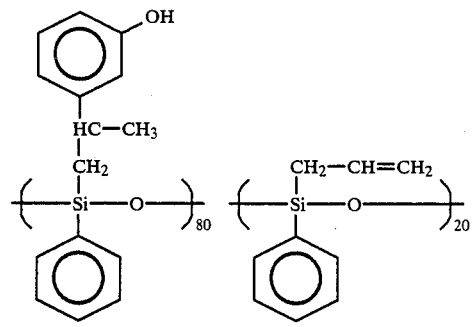

in 85 parts by weight of 1-acetoxy-2-ethoxyethane.

Next, a commercially available novolak-based resist OFPR-800 (manufactured by Tokyo Applied Chemistry Company) was spread over a silicon wafer by the use of a spinner. A bottom layer was formed by drying it for 1 hour at 220° C. The thickness of the bottom layer was 2.0 μm. On top of it, there was spread by spinner the silicone resist solution obtained in the above. By drying it for 2 minutes at 90° C. on the hot plate, there was produced a silicone resist film of thickness of 0.5 μm.

Then, a resist pattern was formed by exposing the obtained film to electron beams (20 kV and 50 μc) with pattern width of 0.2 μm, and by carrying out development for 60 seconds in a 2.5% aqueous solution of tetramethylammoniumhydroxide. With etching for 30 minutes by means of oxygen gas plasma ($2 \times 10^{-2}$ Torr and 0.06 W/cm$^2$), there was formed a satisfactory pattern with line width 0.2 μm.

EXAMPLE 39

Eighty parts by weight of a polysiloxane (molecular weight: 7,000) that is shown by

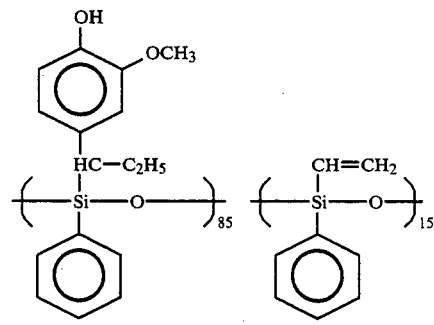

and 20 parts by weight of 3,3'-diazidodiphenylsulfone were mixed with 500 parts by weight of 1-acetoxy-2-ethoxy-ethane to prepare a silicone resist solution. It was spread similar to Example 22 to produce a film.

A mask, which was drawn with chrome on a quartz substrate with a pattern of 0.4 μm line width, was placed in close contact on the film that was obtained in the above, exposed to a radiation from a high tension mercury lamp (250 W) which is used as a light source, and was developed for 90 seconds in a 2.0% aqueous solution of tetramethylammonium hydroxide. When it was treated with oxygen gas plasma similarly to Example 38, there was obtained a pattern with line width 0.4 μm.

EXAMPLE 40

A silicone resist material was prepared by dissolving 15 parts by weight of a polysiloxane (molecular weight: 4,000) that has a structural unit as shown by

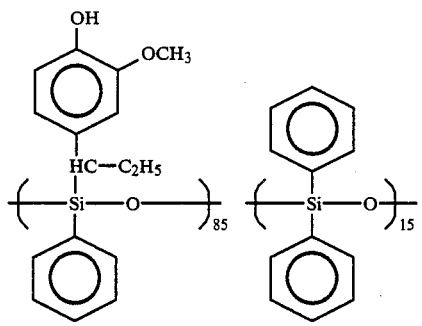

in 85 parts by weight of 1-acetoxy-2-ethoxyethane. Giving spreading, drying, and exposure similar to Example 38, developing for 60 seconds with 2.3% aqueous solution of tetramethylammonium hydroxide, and after treating with O₂ gas plasma as in Example 38, there was obtained a satisfactory pattern of line width 0.2 μm that has a sensitivity of 100 μc.

EXAMPLE 41

A silicone resist material was prepared analogously to Example 40, except for an addition of 5 parts by weight of 3,3'-diazido-diphenylsulfone as the azido compound for 15 parts by weight of polysiloxane. As a result, there was obtained a satisfactory pattern with line width 0.2 μm that has a sensitivity of 20 μc.

EXAMPLE 42

A silicone resist material was prepared similar to Example 40, by adding 4 parts by weight of 2,3,4,4'-tetrahydroxy-benzophenone-tri (1,2-naphthoquinone-2-diazido-5-sulfonic acid) ester as the photosensitive agent for 15 parts by weight of polysiloxane. The product was spread and a film was formed similarly to Example 38. Then, exposure was carried out by using a contracted projection and exposure apparatus (wavelength of the light source: g-line; lens aperture number NA=0.42), and it was developed for 90 seconds using 2.38% aqueous solution of tetramethylammonium hydrozide. After an O₂ gas RIE, there was obtained a pattern with line width 0.5 μm.

EXAMPLE 43

Fifteen parts by weight of a polysiloxane (molecular weight: 5,000) that has a structural unit as shown by

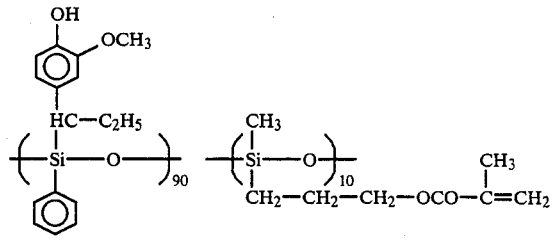

was dissolved in 85 parts by weight of 1-acetoxy-2-ethoxy-ethane to prepare a silicone resist material. It was spread, dried, and exposed similar to Example 38, and was developed for 60 seconds using 2,38% aqueous solution of tetramethylammonium hydroxide. After an O₂ gas plasma treatment similar to Example 38 there was obtained a satisfactory pattern with line width 0.2 μm that has a sensitivity of 40 μc.

EXAMPLE 44

A silicone resist material was prepared similar to Example 43 in which 5 parts by weight of 3,3'-diazidophenyl-sulfone was added as the photosensitive agent to 15 parts by weight of the polysiloxane of Example 43. It was spread, dried, and exposed similar to Example 38, and was developed for 45 seconds using 2.38% aqueous solution of tetramethylammonium hydroxide. After an O₂ gas plasma treatment there was obtained a satisfactory pattern with line width 0.2 μm that has a sensitivity of 5 μc.

EXAMPLE 45

A silicone resist material was prepared by dissolving 10 parts by weight of a polysiloxane (molecular weight: 5,000) that has a structural unit as shown by

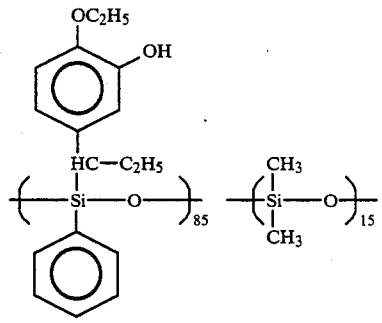

and 5 parts by weight of a novolak resin (molecular weight: 4,000) that has a composition of (m-cresol:p-cresol:2,5-xylenol=45:25:30) in 85 parts by weight of 1-acetoxy-2-ethoxyethane. It was spread, dried, and exposed similar to Example 38, and was developed for 60 seconds by using 5% aqueous solution of choline. After an O₂ gas plasma treatment similar to Example 38 there was obtained a satisfactory pattern with line width 0.2 μm that has a sensitivity of 100 μc.

EXAMPLE 46

A silicone resist material was prepared similar to Example 45 by adding 5 parts by weight of 1-cyano-1-(4-azidophenyl)-4-furyl-1,3-butadiene as the photosensitive agent for 15 parts by weight of the polysiloxane and the novolak resin of Example 45. It was spread, and a film was formed similar to Example 18. Then, exposure was carried out by the use of a contracted projection and exposure apparatus (wavelength of the light source: g-line; lens aperture number NA=0.42), and development was carried out for 60 seconds using 5% aqueous solution of choline. After an $O_2$ gas plasma treatment similar to Example 38 there was obtained a satisfactory pattern with line width 0.5 μm.

EXAMPLE 47

An amount, 20.2 g, of triethylamine was added to 1 l THF solution of 18.3 g of 4-hydroxymethyl-2-nitrobenzyl alcohol, and was heated to 50° C. while stirring. Into this solution was dropped 200 ml THF solution of 19.1 g of methylphenyldichlorosilane, by taking a time of 2 hours. After that, the solution was refluxed around while heating. Then, the salt produced was filtered out and the filtrate was concentrated to obtain a photosensitive composite of the present invention.

A bottom layer with film thickness of 1.8 μm was formed by spreading a positive type resist, OFPR-800, (manufactured by Tokyo Ohka Kogyo K.K.) on a silicon wafer by means of a spinner, and by drying it in a clean oven (at 200° C. for 1.5 hours). Next, a photosensitive film of thickness 0.5 μm was formed by spreading by means of a spinner a 5% xylene solution of the photosensitive composite of the present invention obtained above, and by heating it on a hot plate (at 100° C. for 3 hours). Then, the substrate was exposed for 10 seconds to the radiation from a high pressure mercury lamp of 250 W, using a quartz mask. The substrate obtained in this way was developed using 5% methanol aqueous solution of 5.0% tetramethylammonium hydroxide. Then, by washing with water and drying on a hot plate (at 130° C. for 5 minutes), there was formed a pattern that consists of 1 μm lines and spaces. By further treating the substrate with oxygen gas plasma (0.05 Torr, 0.06 W/cm², and 30 minutes), there was formed on the resist layer of the bottom layer a pattern that consists of 1 μm lines and spaces.

EXAMPLE 48

To 1 l THF solution of 16.9 g of 4-hydroxy-2-nitrobenzyl alcohol, 20.2 g of triethylamine was added, and the mixture was heated to 50° C. while stirring. Into this solution, 200 ml THF solution of 20.5 g of ethylphenyldichlorosilane was dropped by spending a time of 2 hours. Then, the mixture was heated for 2 hours while being refluxed. After that, salt that was formed was filtered out and the filtrate was concentrated to obtain a photosensitive composite of the present invention.

When treatments analogous to those of Example 40 were given to the photosensitive composite thus obtained, it was found that there was formed a pattern that consists of lines with 1 μm width and spaces.

What is claimed is:

1. A silicone containing resist material for forming a resist pattern on a semiconducting material by exposure to irradiation and alkaline development, comprising a photosensitive agent and a polysiloxane that contains a structure consisting essentially of units of the formula:

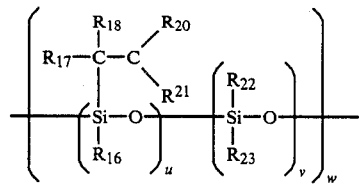

wherein
$R_{16}$ is an alkyl group with 1 to 10 carbon atoms, or a substituted or nonsubstituted aryl group with 6 to 14 carbon atoms,
at least one of substituent groups $R_{17}$ to $R_{21}$ is a group containing a phenolic hydroxy group, and the groups other than the group containing the phenolic hydroxy group $R_{17}$ to $R_{21}$ may be identical or may be different, each representing a hydrogen atom, a halogen atom, an alkyl group, an alkylcarbonyl group, an alkoxycarbonyl group, an alkoxy group, an alkoxyalkyl group, an acyloxy group, an allyl group, or a substituted or nonsubstituted aryl group with 6 to 14 carbon atoms,
$R_{22}$ and $R_{23}$ may be identical or may be different, each representing a vinyl group, an allyl group, an alkyl group with 1 to 10 carbon atoms, an aryl group, a siloxy group, a substituted siloxy group, or a group represented by $-CH_2-CH_2-CH_2-OCO-C(CH_3)=CH_2$,
u and w are positive integers and v is zero or a positive integer,
wherein said photosensitive agent is an azido compound or diazonium salt.

2. The silicone resist material of claim 1, wherein for the case of v≧1, said photosensitive agent is a diazido compound.

3. The silicone resist material of claim 1, wherein the compounding ratio of said polysiloxane and photosensitive agent is 5 to 100 parts by weight of the photosensitive agent to 100 parts by weight of the polysiloxane.

4. The silicone resist material of claim 1, wherein said photosensitive agent is a naphthoquinonediazidosulfonic acid ester.

5. The silicone resist material of claim 2, wherein said photosensitive agent is a naphthoquinonediazidosulfonic acid ester.

* * * * *